United States Patent
You et al.

(10) Patent No.: US 10,361,159 B2
(45) Date of Patent: Jul. 23, 2019

(54) SEMICONDUCTOR DEVICE HAVING CONTACTS WITH VARYING WIDTHS

(71) Applicant: Samsung Electronics Co., Ltd., Suwon-si, Gyeonggi-do (KR)

(72) Inventors: Jong Ho You, Seongnam-si (KR); Sang Young Kim, Gyeonggi-do (KR); Byung Chan Ryu, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/820,509

(22) Filed: Nov. 22, 2017

(65) Prior Publication Data

US 2018/0286808 A1 Oct. 4, 2018

(30) Foreign Application Priority Data

Apr. 3, 2017 (KR) .................. 10-2017-0042971

(51) Int. Cl.
| | | |
|---|---|---|
| H01L 21/76 | (2006.01) |
| H01L 21/82 | (2006.01) |
| H01L 29/41 | (2006.01) |
| H01L 29/66 | (2006.01) |
| H01L 29/78 | (2006.01) |
| H01L 23/528 | (2006.01) |
| H01L 23/522 | (2006.01) |
| H01L 29/417 | (2006.01) |
| H01L 21/768 | (2006.01) |
| H01L 29/45 | (2006.01) |

(Continued)

(52) U.S. Cl.
CPC .... *H01L 23/5283* (2013.01); *H01L 21/76831* (2013.01); *H01L 21/76846* (2013.01); *H01L 21/823431* (2013.01); *H01L 23/5226* (2013.01); *H01L 29/41791* (2013.01); *H01L 29/456* (2013.01); *H01L 29/66795* (2013.01); *H01L 29/7851* (2013.01); *H01L 23/53223* (2013.01); *H01L 23/53266* (2013.01); *H01L 2029/7858* (2013.01)

(58) Field of Classification Search
CPC ........... H01L 23/5283; H01L 21/76831; H01L 21/76846; H01L 23/5226; H01L 29/41791; H01L 29/456; H01L 29/7851; H01L 23/53223; H01L 23/53266; H01L 2029/7858
USPC ................................. 257/241, 384
See application file for complete search history.

(56) References Cited

U.S. PATENT DOCUMENTS

| | | |
|---|---|---|
| 8,009,477 B2 | 8/2011 | Kleint et al. |
| 8,970,015 B2 | 3/2015 | Chang et al. |

(Continued)

FOREIGN PATENT DOCUMENTS

| | | |
|---|---|---|
| KR | 0168158 | 12/1998 |
| KR | 1020090070534 | 7/2009 |
| KR | 10-2016-0012452 | * 2/2016 |

*Primary Examiner* — Didarul A Mazumder
(74) *Attorney, Agent, or Firm* — Sughrue Mion, PLLC

(57) ABSTRACT

A semiconductor device includes a substrate having a plurality of fins protruding therefrom and an active region on the fins. The device further includes a contact including a conductive region having a concave portion defining an upper portion and a lower portion of the conductive region, an interlayer insulating layer on the active region, and a side insulating layer interposed between the interlayer insulating layer and the lower portion of the conductive region.

19 Claims, 36 Drawing Sheets

(51) Int. Cl.
  *H01L 21/8234*   (2006.01)
  *H01L 23/532*    (2006.01)

(56) References Cited

U.S. PATENT DOCUMENTS

| | | |
|---|---|---|
| 9,257,531 B2 | 2/2016 | Seo et al. |
| 9,299,608 B2 | 3/2016 | Wu et al. |
| 9,449,915 B2 | 9/2016 | Lee et al. |
| 2016/0254383 A1* | 9/2016 | Wann ................ H01L 29/41791 257/190 |
| 2016/0260812 A1 | 9/2016 | Horak et al. |
| 2016/0284700 A1* | 9/2016 | Yoon ................... H01L 27/0886 |
| 2016/0293717 A1* | 10/2016 | Kim ................... H01L 29/41791 |
| 2016/0351570 A1* | 12/2016 | Park ................... H01L 27/0924 |

* cited by examiner

SEMICONDUCTOR DEVICE HAVING CONTACTS WITH VARYING WIDTHS

CROSS-REFERENCE TO RELATED APPLICATION(S)

This application claims benefit of priority to Korean Patent Application No. 10-2017-0042971 filed on Apr. 3, 2017 in the Korean Intellectual Property Office, the disclosure of which is incorporated herein by reference in its entirety.

BACKGROUND

1. Field

The present inventive concept relates to semiconductor devices and methods of fabrication the same.

2. Description of Related Art

Semiconductor devices are an important part of the electronics industry. Storage devices storing data, processors operationally processing data, and the like, may be implemented by semiconductor devices. Research into increasing the integration of devices and lowering power consumption in semiconductor devices has been carried out. In order to overcome limitations due to a reduction in the size of semiconductor elements included in semiconductor devices, research into the development of three-dimensional semiconductor devices is being undertaken.

SUMMARY

An aspect of the present inventive concept is to provide a semiconductor device having improved yield by reducing defects in a manufacturing process.

According to some embodiments, a semiconductor device includes a substrate having a plurality of fins protruding therefrom and an active region on the fins. The device further includes a contact including a conductive region having a concave portion defining an upper portion and a lower portion of the conductive region, an interlayer insulating layer on the active region, and a side insulating layer interposed between the interlayer insulating layer and the lower portion of the conductive region.

According to an aspect of the present inventive concept, a semiconductor device includes a plurality of fin structures on a substrate, an active region on the plurality of fin structures, and a contact connected to the active region and including a plurality of layers. At least one of the plurality of layers includes a lower region containing a first region having a width increased away from the active region and a second region disposed on the first region and having a width reduced away from the active region, and an upper region disposed on the lower region and having a width increased away from the active region.

Still further embodiments provide a semiconductor device including a plurality of fins protruding from a substrate, an active region on the plurality of fins, and a contact on the active region and including a conductive region having a convex upper portion, a convex lower portion and a narrowed portion between the upper and lower portions. An insulating layer may conform to a sidewall of the lower portion of the conductive region and terminate proximate the narrowed portion of the conductive region.

BRIEF DESCRIPTION OF DRAWINGS

The above and other aspects, features, and advantages of the present disclosure will be more clearly understood from the following detailed description when taken in conjunction with the accompanying drawings, in which.

DETAILED DESCRIPTION

Hereinafter, example embodiments of the present inventive concept will be described with reference to the accompanying drawings.

Figure 1:
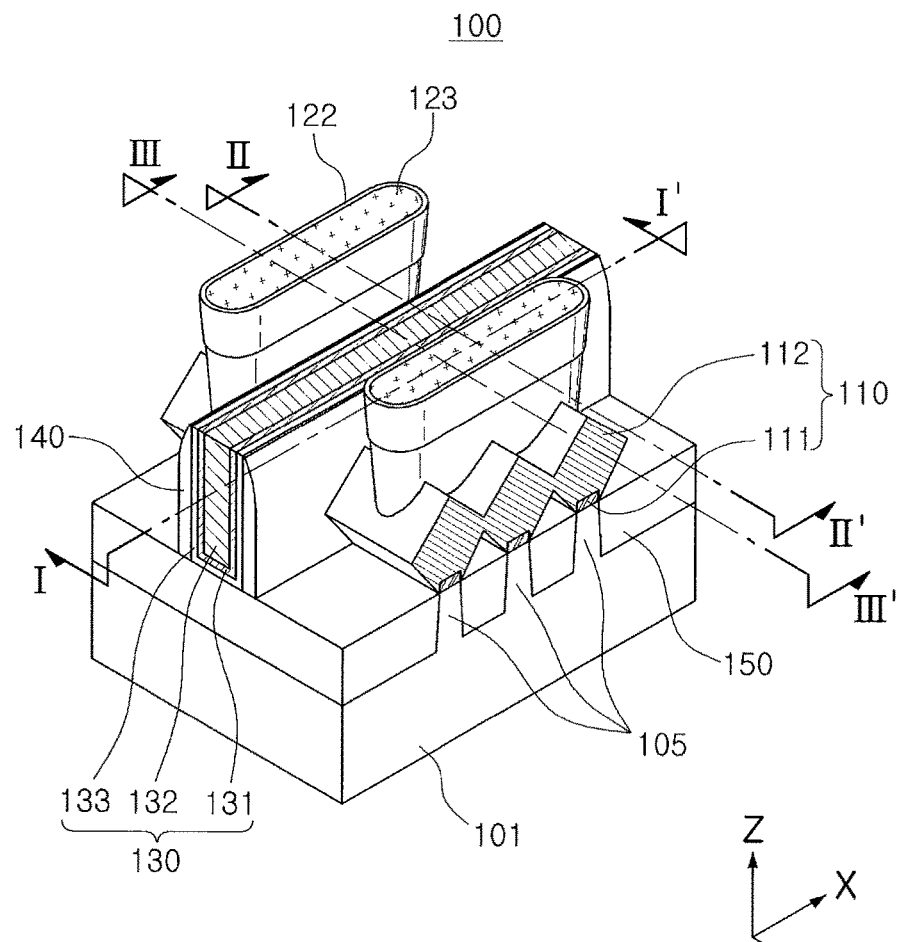
FIG. 1 is a perspective view of a semiconductor device according to some example embodiments of the present inventive concept.
Figure 2A:
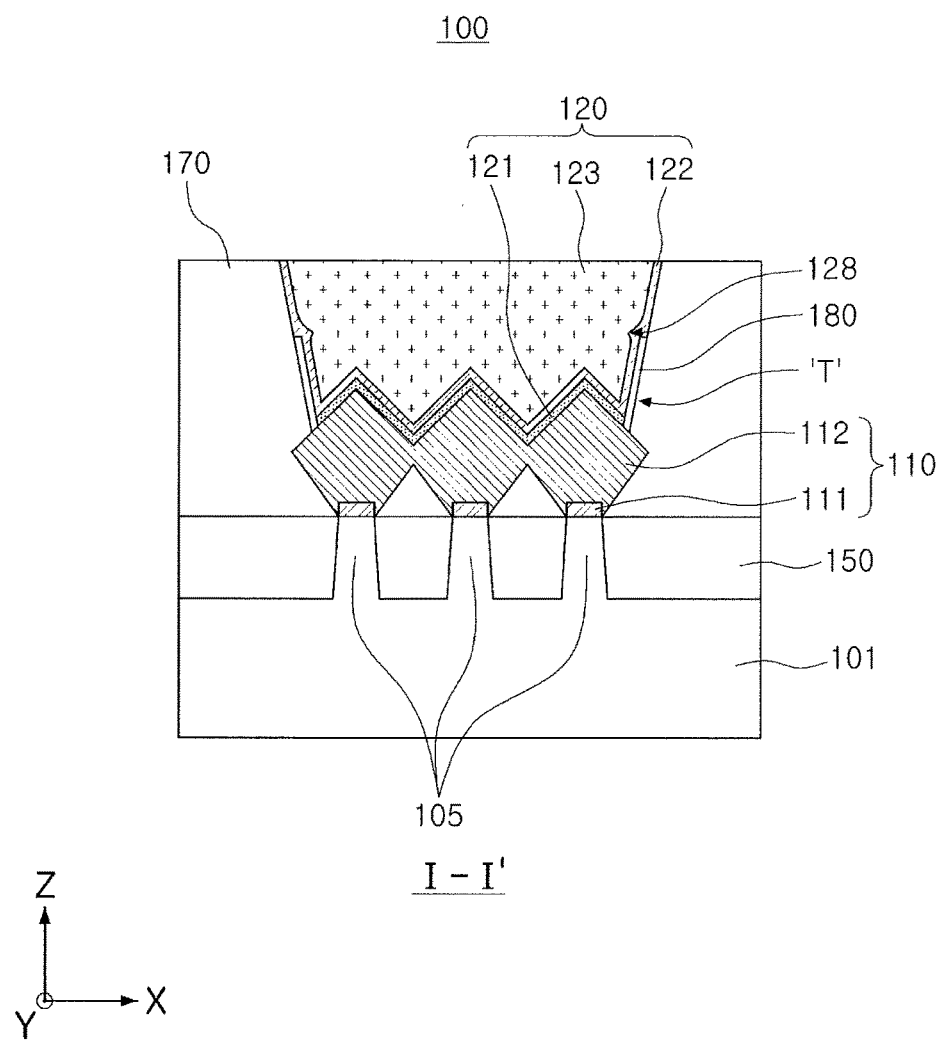
FIGS. 2A and 2B are cross-sectional views of a semiconductor device illustrated in FIG. 1, taken along line I-I'.
Figure 2B:
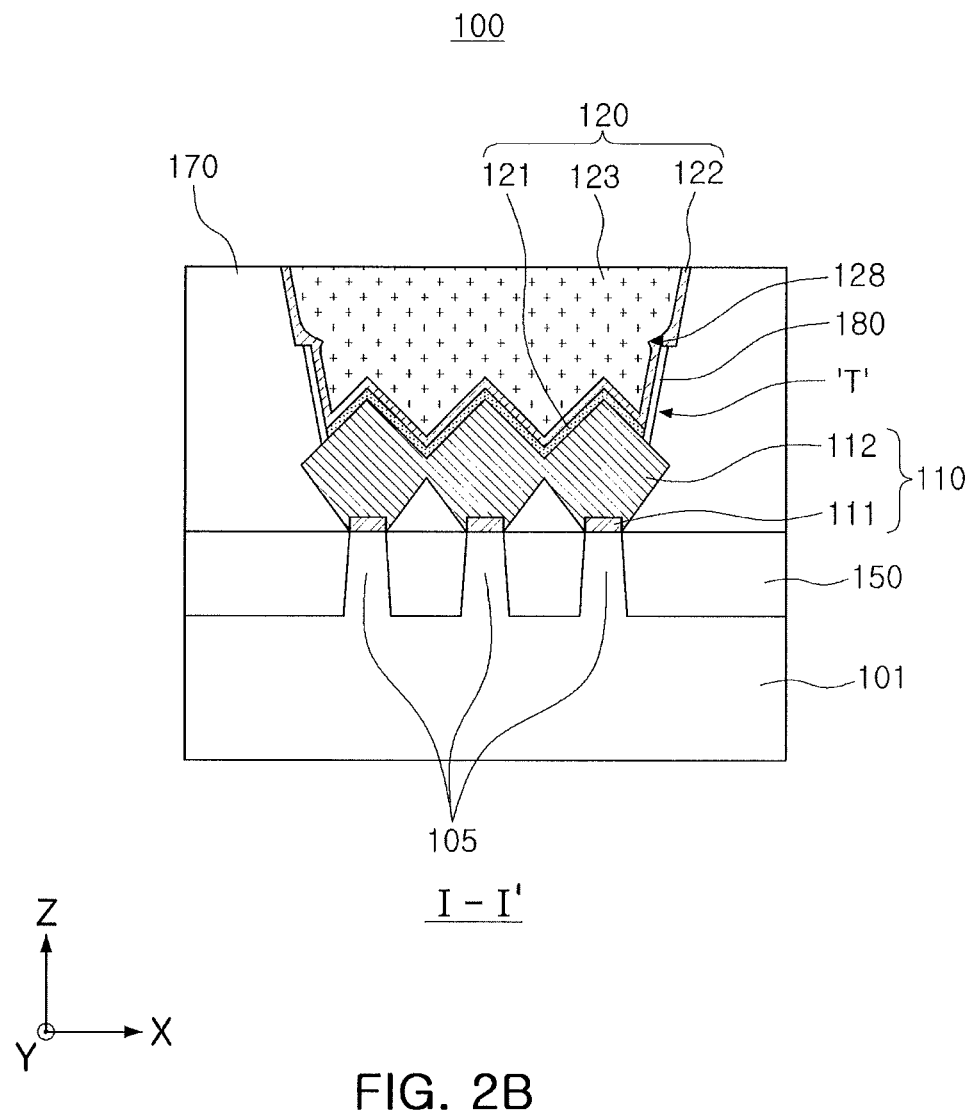
Figure 3A:
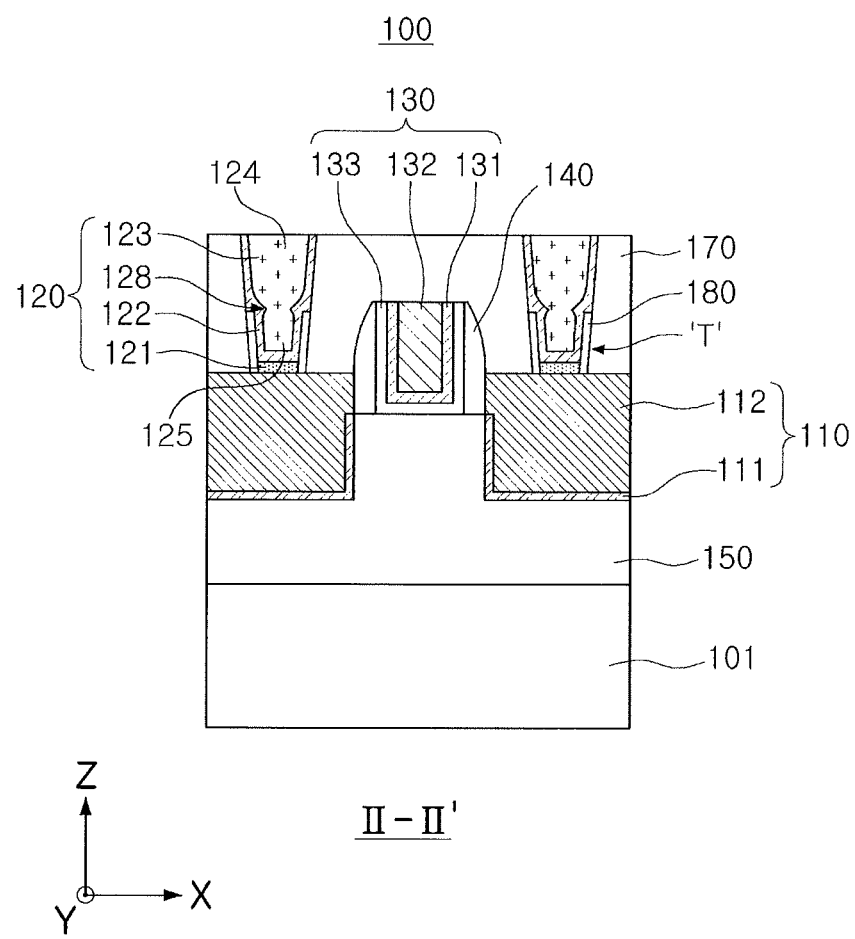
FIGS. 3A and 3B are cross-sectional views of the semiconductor device illustrated in FIG. 1, taken along line II-II'.
Figure 3B:
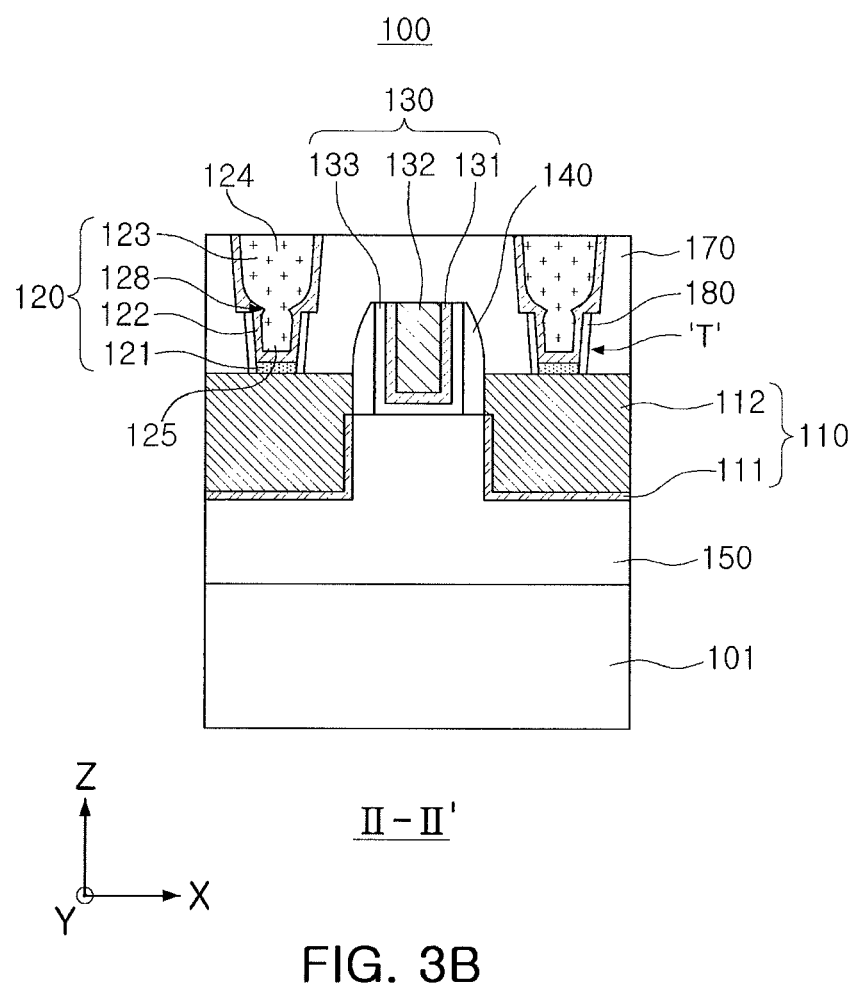
Figure 4A:
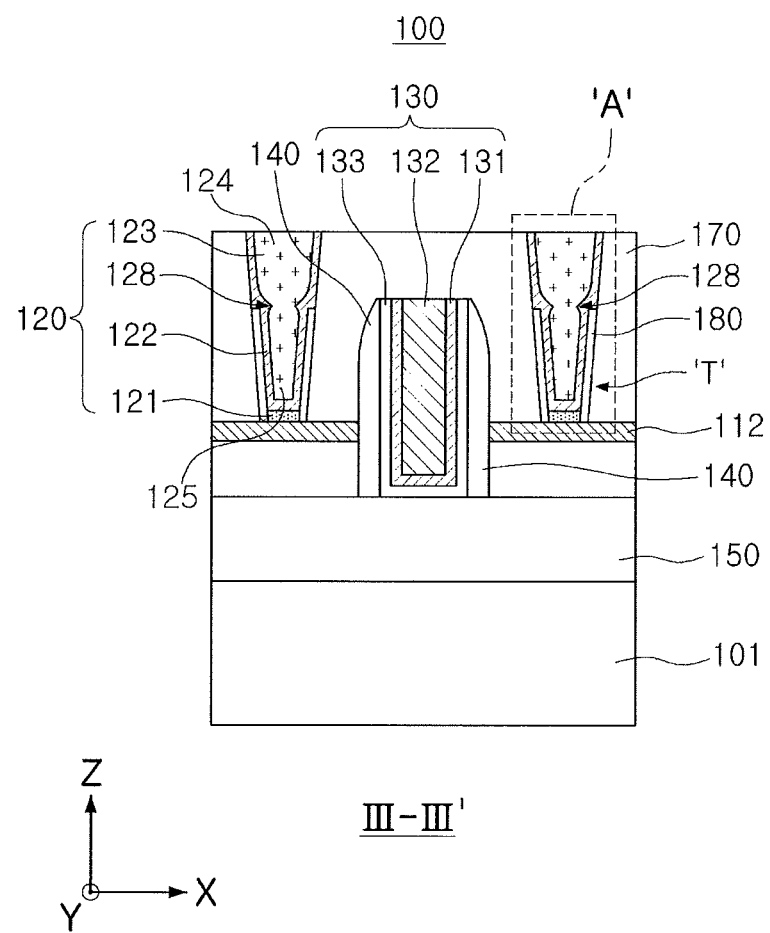
FIGS. 4A and 4B are cross-sectional views of the semiconductor device illustrated in FIG. 1, taken along line III-III'.
Figure 4B:
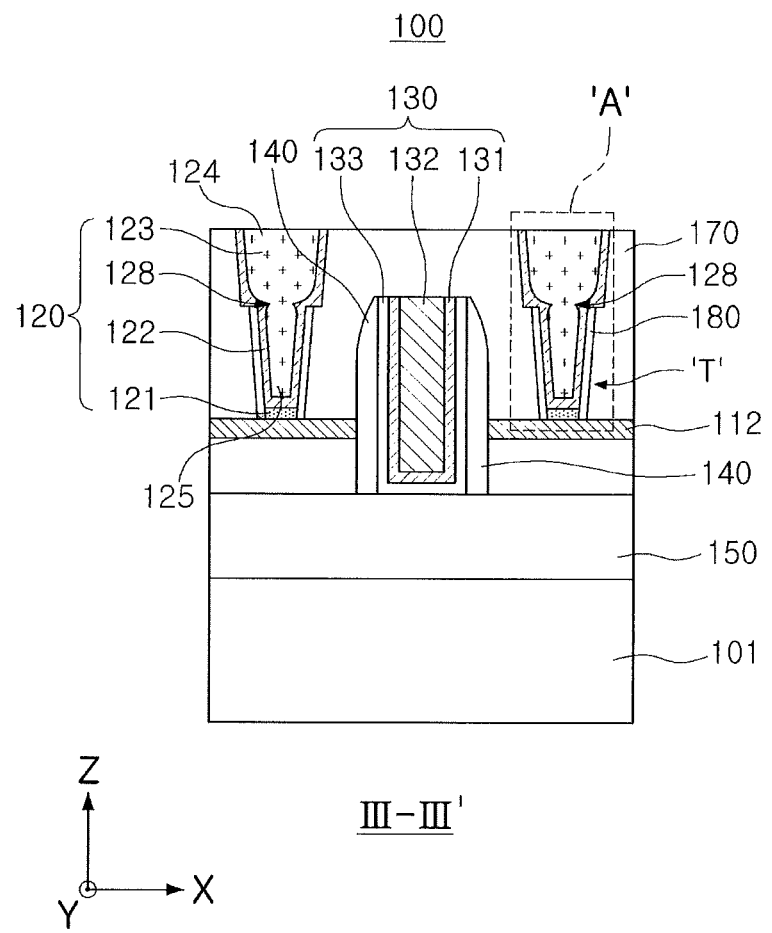

FIG. 1 is a perspective view illustrating a semiconductor device according to some example embodiments. FIGS. 2A and 2B are cross-sectional views of the semiconductor device illustrated in FIG. 1, taken along line I-I, and FIGS. 3A and 3B are cross-sectional views of the semiconductor device illustrated in FIG. 1, taken along line II-II'. FIGS. 4A and 4B are cross-sectional views of the semiconductor device illustrated in FIG. 1, taken along line III-III'.

Hereinafter, a semiconductor device 100 according to some example embodiments will be described with reference to FIGS. 1 to 4B. For convenience of explanation, components are partially omitted from FIGS. 1 to 4B. For example, an interlayer insulating layer 170 illustrated in FIGS. 2A to 4B is omitted from FIG. 1.

Referring to FIG. 1, the semiconductor device 100 may include a gate structure 130 extending in a first direction, for example, an X-axis direction, and a plurality of fin structures extending in a second direction, for example, a Y-axis direction, to intersect with the gate structure 130. The plurality of fin structures 105 may be formed to protrude from an upper surface of a semiconductor substrate 101, and an element isolation film 150 including an insulating material may be provided between the plurality of fin structures 105.

The gate structure 130 may include first and second gate metal layers 131 and 132 and a gate insulating layer 133. The gate insulating layer 133 may be disposed between the first gate metal layers 131 and the plurality of fin structures 105. A gate spacer 140 formed of an insulating material may be disposed on side surfaces of the gate structure 130, and an active region 110 may be formed outside of the first gate spacer 140.

The active region 110 may provide a source region and a drain region of the semiconductor device 100, and may have an elevated source/drain structure in which upper surfaces of the source and drain regions are disposed higher than a lower surface of the gate structure 130. In some example embodiments of FIGS. 1 to 4B, although the active region 110 is illustrated as having a pentagonal shape, the active region 110 may have various shapes. For example, the active region 110 may have one of polygonal, circular, and rectangular shapes. The active region 110 may have a structure in which regions thereof are connected to each other or are merged with each other on the plurality of fin structures 105. Although it is assumed that a single active region 110 is connected to three fin structures 105 in the example embodiment illustrated in FIGS. 1 to 4B, the number of fin structures 105 connected to one active region 110 may vary in various example embodiments.

A material included in the active region 110 may be changed depending on a type of the semiconductor device 100. In some example embodiments, for example, when the semiconductor device 100 is an n-type metal oxide semiconductor (NMOS) transistor, the active region 110 may be formed of silicon (Si), and when the semiconductor device 100 is a p-type metal oxide semiconductor (PMOS) transistor, the active region 110 may be formed of silicon germanium (SiGe).

The active region 110 may include a first region 111 and a second region 112. The first region 111 may be provided as regions grown from the fin structures 105, and the second region 112 may be provided as a region grown from the first region 111. The first region 111 and the second region 112 may be doped with an n-type or p-type impurity, and may have different doping concentrations according to some example embodiments.

A contact 120 may be disposed on the active region 110 and connected thereto, and the active region 110 and the contact 120 may be covered by the interlayer insulating layer 170. In some example embodiments, the contact 120 may be formed in an interior of a trench T formed in the interlayer insulating layer 170. Referring to FIGS. 2A and 2B, illustrating cross sections of the semiconductor device 100 taken in a direction of I-I', the contact 120 may include a plurality of layers 121, 122 and 123. In some example embodiments of the present inventive concept, the contact 120 may include a first layer 121, a second layer 122, and a third layer 123 sequentially stacked.

In some example embodiments, the first layer 121 may be a metal silicide layer, and may be a layer obtained when titanium (Ti), cobalt (Co), nickel (Ni), tungsten (W), copper (Cu), tantalum (Ta), platinum (Pt), hafnium (Hf), molybdenum (Mo), radium (La), or any alloy thereof reacts with silicon (Si). The first layer 121 may be formed on a portion of a surface of the active region 110, and may be formed on an upper surface of the active region 110 exposed in a process of forming the trench T in some example embodiments. In some example embodiments, the first layer 121 may be formed by depositing a metal material on a portion of the surface of the active region 110 using a physical vapor deposition (PVD) process and heat treating the deposited metal material.

The second layer 122 formed on the first layer 121 may be a barrier metal layer. In some example embodiments, the second layer 122 may include titanium nitride (TiN), tantalum nitride (TaN), tungsten nitride (WN), or the like, and may be formed along internal side surfaces of the interlayer insulating layer 170 and the side insulating layer 180 and an upper surface of the first layer 121. The second layer 122 may also include a plurality of layers formed of different materials. The third layer 123 formed on the second layer 122 may be a contact metal layer, and may include a metal material such as tungsten (W), aluminum (AL), molybdenum (Mo) or the like. The third layer 123 may fill a space formed in the second layer 122.

In some example embodiments, the third layer 123 may have a concave portion 128. The third layer 123 may also include a plurality of layers formed of different materials. The third layer 123 may include an upper region and a lower region defined by the concave portion 128. For example, the concave portion 128 may be formed adjacently to a boundary between the upper region and the lower region. A width of the upper region may be increased in a direction away from an upper surface of the semiconductor substrate 101. A width of the lower region may gradually increase and then decrease again in direction away from the upper surface of the semiconductor substrate 101.

In some example embodiments, the concave portion 128 may be formed due to the side insulating layer 180 being formed prior to the formation of the contact 120. The side insulating layer 180 may only be limited to a side surface of the lower region 125 of the third layer 123 and the interlayer insulating layer 170, and may not extend to lie between a side surface of the upper region 124 and the interlayer insulating layer 170. In addition, a boundary between the upper region and the lower region of the third layer 123 may be adjacent to an edge formed by an upper surface and a side surface of the side insulating layer 180.

Comparing FIGS. 2A and 2B, 3A and 3B, and 4A and 4B, which illustrate various example embodiments of the present inventive concept, an upper region of the contact 120 may have a greater width than that of a lower region thereof, and the width of the upper region of the contact may be increased from the concave portion 128 of the third layer 123. Referring to FIGS. 2B, 3B and 4B, the second layer 122, in a position thereof adjacent to the concave portion 128, may have a step portion. The upper region of the third layer 123 may have a relatively wide width due to a step structure of the second layer 122. By increasing the width of the upper region 124 of the third layer 123, a defect rate in a process of connecting a metal line provided on an upper portion of the semiconductor device 100 to the contact 120 may be reduced, and thus, yield in manufacturing the device may be improved.

The structure and features of each contact 120 may be variously changed in various example embodiments. Hereinafter, a semiconductor device will be described with reference to FIGS. 5A to 5C and FIGS. 6 to 8.

FIGS. 5A to 5C and FIGS. 6 to 8 are enlarged views of contacts of semiconductor devices according to various example embodiments. Hereinafter, contacts 120, 220, 320, and 420 according to various example embodiments will be described with reference to FIGS. 5A to 5C and FIGS. 6 to 8. The contacts 120, 220, 320 and 420 illustrated in FIGS. 5A to 5C and FIGS. 6 to 8 are example embodiments of the present inventive concept, and other embodiments may have different shapes.

Figure 5A:
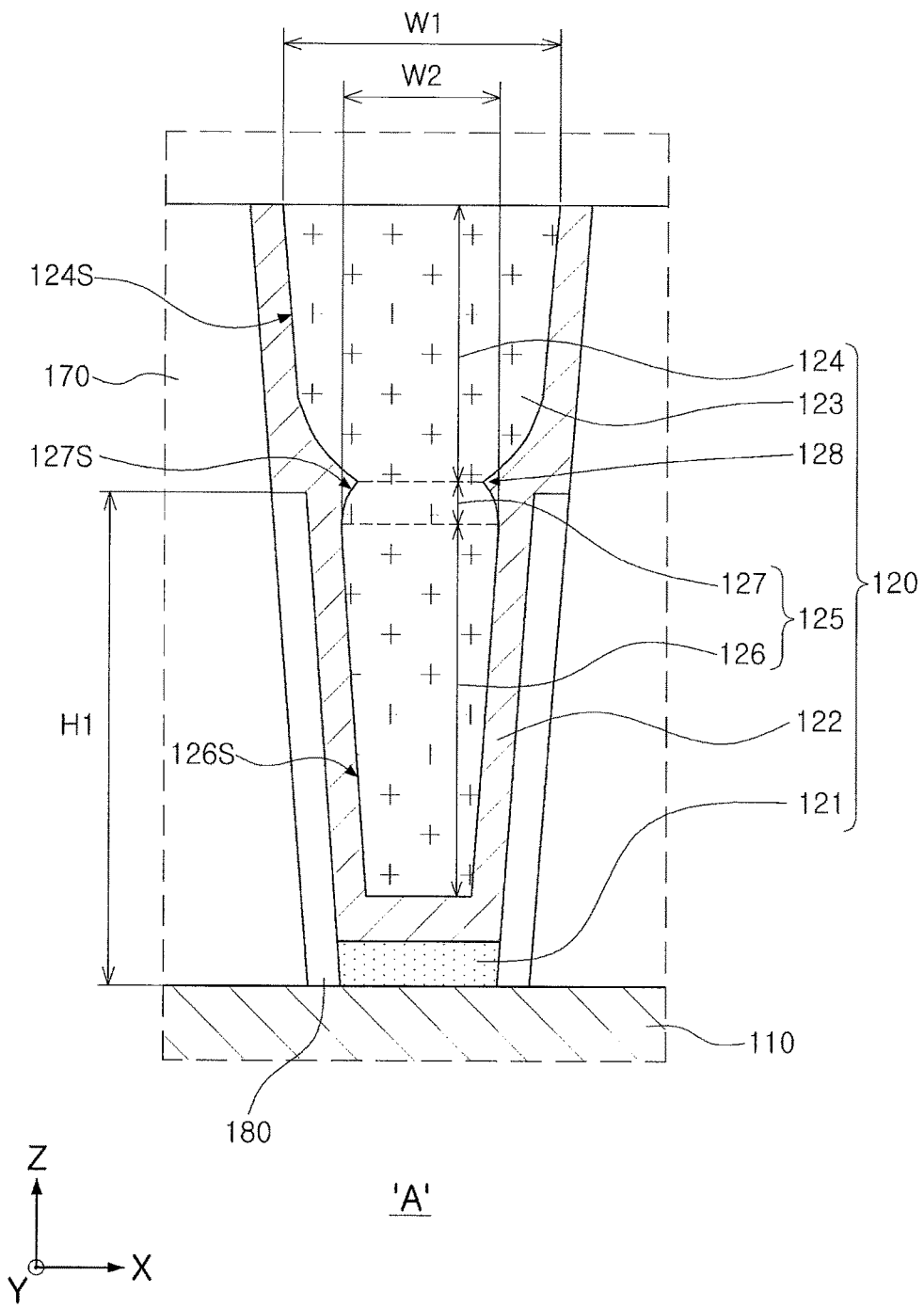
FIGS. 5A to 5C are enlarged views of a contact of a semiconductor device according to various example embodiments of the present inventive concept.

Referring to FIG. 5A, the contact 120 may be formed in an interlayer insulating layer 170, and may include a first layer 121, a second layer 122, and a third layer 123. The first layer 121 may be formed in a trench formed by removing a portion of the interlayer insulating layer 170, and may be connected to an active region 110. In some example embodiments, the first layer 121 may be a metal silicide layer, and the second layer 122 may be a barrier metal layer. The first layer 121 may only be formed on a portion of an upper surface of the active region 110, exposed in the trench.

The third layer 123 may be formed on the second layer 122, and may include an upper region 124 and a lower region 125. The lower region 125 may include a first region 126 and a second region 127, and the second region 127 may connect the upper region 124 and the first region 126 to each other. A width of the first region 126 may gradually increase in a direction away from an upper surface of the active region 110, and a width of the second region 127 may gradually decrease in the direction away from the upper surface of the active region 110. A width of the upper region 124 may gradually increase in the direction away from the upper surface of the active region 110.

With reference to an example embodiment illustrated in FIG. 5A, a maximum value W1 of a cross-sectional width of the upper region 124 may be greater than a maximum value W2 of a cross-sectional width of the lower region 125. In some example embodiments of the present inventive concept, since the maximum value of the width of the contact 120 appears on an upper surface of the third layer 123, the alignment and a connection process of the contact 120 with a metal line and the like provided on an upper portion of the contact 120 may proceed more accurately and efficiently.

Due to the structure as described above, a concave portion 128 of the third layer 123 may be formed between the upper region 124 and the lower region 125 of the third layer 123. In some example embodiments, a side insulating layer 180 may be formed between at least a portion of the second layer 122 and the interlayer insulating layer 170. The second layer 122 may include a convex portion adjacent to an upper surface of the side insulating layer 180 in a manufacturing process. By the convex portion, the concave portion 128 may be formed in the process of forming the second layer 122 and then forming the third layer 123. Due to the convex portion, the second layer 122 may have a maximum width in a region thereof adjacent to the upper surface of the side insulating layer 180.

Side surfaces 124S, 126S and 127S of the third layer 123 may be convex in shape. In some example embodiments, the side surface 124S of the upper region 124 may have a curved convex shape, and the width of the upper region 124 may decrease toward to an upper surface of the active region 110. The side surface 126S of the first region 126 and the side surface 127S of the second region 127, included in the lower region 125, may also have a convex shape. As the side surface 126S of the first region 126 and the side surface 127S of the second region 127 all have a convex shape, a width of the lower region 125 at a boundary between the first region 126 and the second region 127 may have a maximum value W2 of a cross-sectional width of the lower region 125.

The second layer may be limited to a location between the side surface of the upper region 124 and the interlayer insulating layer 170, without the side insulating layer 180 disposed therebetween. Between the side surface of the lower region 125 and the interlayer insulating layer 170, the side insulating layer 180 may further be provided in addition to the second layer 122. A height H1 of the side insulating layer 180, for example, an upper surface height level thereof, may be lower than a height of a boundary surface between the upper region 124 and the lower region 125. The side insulating layer 180 may be formed of a material different from that of the interlayer insulating layer 170. In some example embodiments, the interlayer insulating layer 170 may be formed of a silicon oxide, and the side insulating layer 180 may be formed of silicon nitride.

Figure 5B:
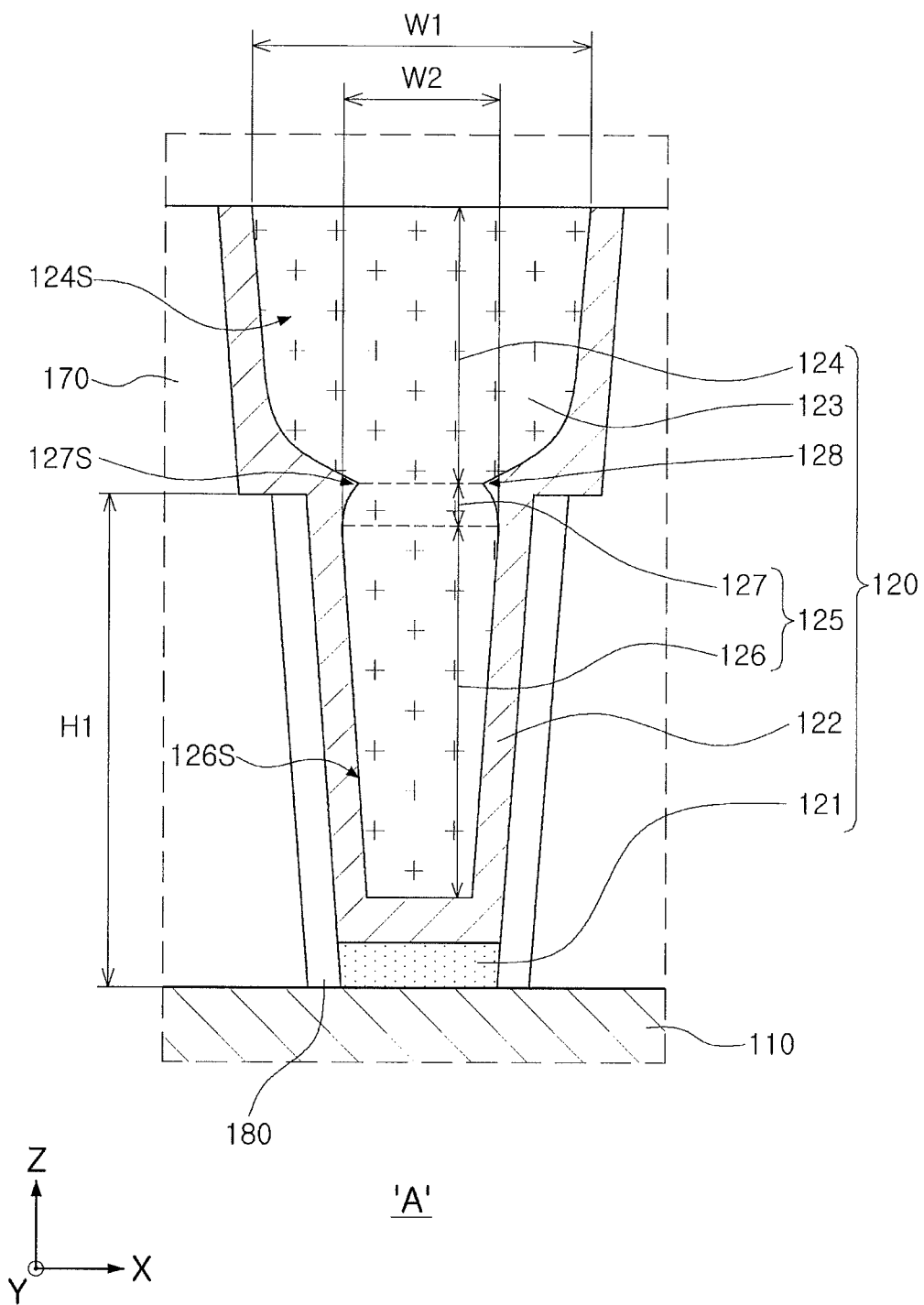

Referring to FIG. 5B, the second layer 122 may have a step structure on the upper surface of the side insulating layer 180. Due to the step structure formed on the second layer 122, a maximum value W1 of a cross-sectional width of the upper region 124 may be greater than that in the example embodiment illustrated in FIG. 5A. Thus, defects that may occur in the alignment and a connection process of a metal line and the like provided on the contact 120 may be reduced. The step structure illustrated in the example embodiment of FIG. 5B may be formed by first forming the side insulating layer 180 inside a trench in which the contact 120 is to be formed and by further etching the interlayer insulating layer 170 to increase a width of an upper portion of the trench upper region.

Figure 5C:
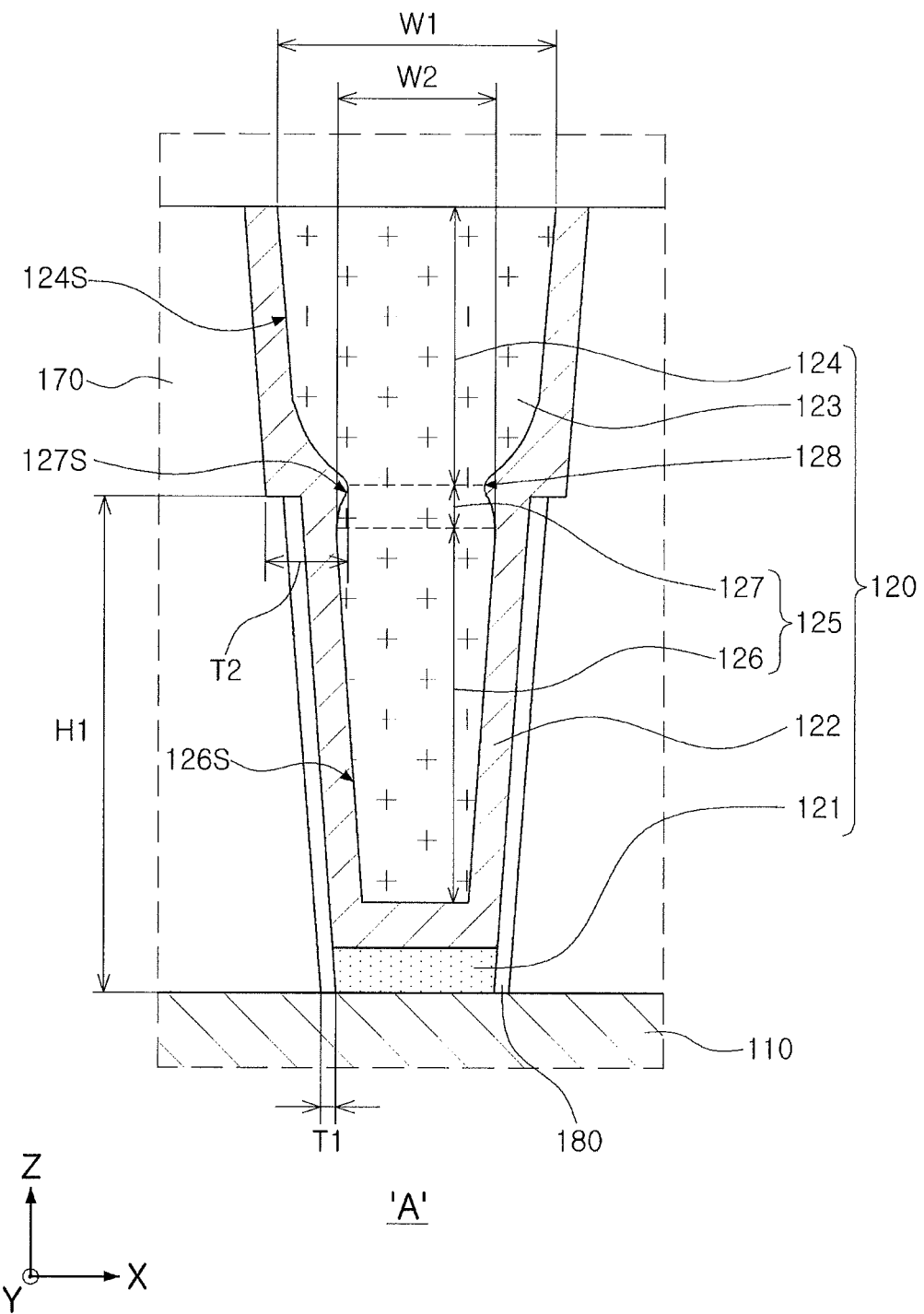

Referring to FIG. 5C, the side insulating layer 180 may have a relatively reduced width as compared to those in the example embodiments illustrated in FIGS. 5A and 5B. In some example embodiments, a width T1 of the side insulating layer 180 may be equal to ⅓ or less of a thickness T2 of the second layer 122 in a position thereof in which a concave portion 128 is formed. The width T2 of the second layer 122 in the position in which the concave portion 128 is formed may have a maximum value of a width of the second layer 122.

In addition, while the concave portions 128 in the example embodiments illustrated in FIGS. 5A and 5B are sharply inflected, the concave portion 128 of the third layer 123 in the example embodiment illustrated in FIG. 5C may have a more blunt shape. By etching at least a portion of the convex portion formed on the second layer 122 to be adjacent to the upper surface of the side insulating layer 180 after forming the second layer 122 and before forming the third layer 123, the more rounded concave portion 128 as in the example embodiment of FIG. 5C may be formed.

Figure 6:
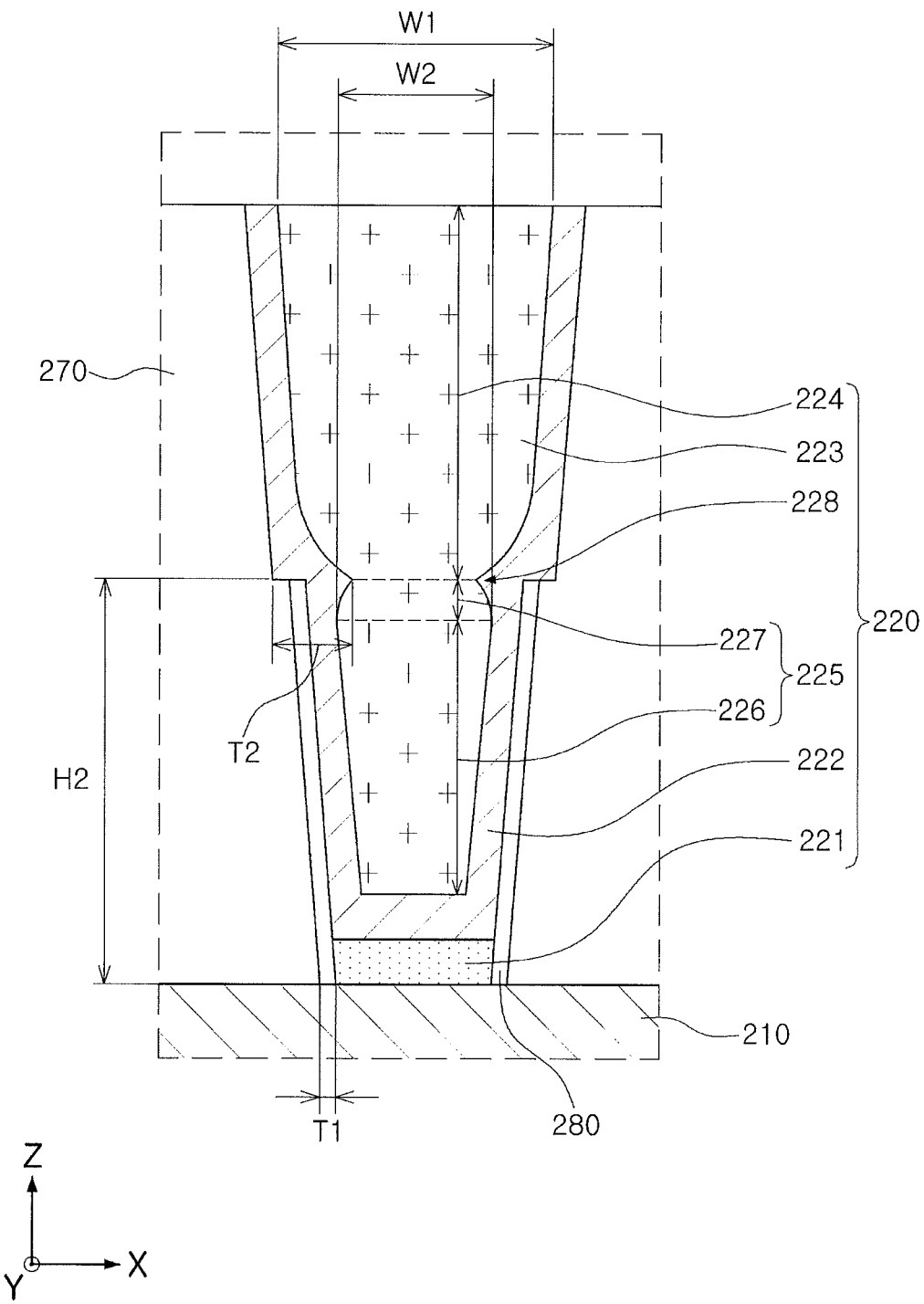
FIGS. 6 to 8 are enlarged views of a contact of a semiconductor device according to various example embodiments of the present inventive concept.

Referring to FIG. 6, in the case of a semiconductor device according to some example embodiments of the present inventive concept, a contact 220 may include a first layer 221, a second layer 222, and a third layer 223. The first layer 221 may be a metal silicide layer, and the second layer 222 may be a barrier metal layer. The third layer 223 may be a contact metal layer, and may be divided into an upper region 224 and a lower region 225.

In some example embodiments illustrated in FIG. 6, the lower region 225 may have a height less than a height of each of the lower regions 125 of the contacts 120 illustrated in the example embodiments of FIGS. 5A to 5C. In addition, the upper region 224 of the contact 220 according to the example embodiment illustrated in FIG. 6 may have a height greater than that of each of the upper regions 124 of the contacts 120 according to the example embodiments illustrated in FIGS. 5A to 5C. For example, a ratio of the height of the upper region 224 to a height of the lower region 225 in the example embodiment illustrated in FIG. 6 may be greater as those in the example embodiments of FIGS. 5A to 5C.

Further, in the example embodiment illustrated in FIG. 6, a height H2 of a side insulating layer 280 may be less than the height H1 of each of the side insulating layers 180 in the example embodiments illustrated in FIGS. 5A to 5C. In the example embodiments of FIGS. 5A to 5C, the height H1 of the side insulating layer 180 may be greater than an upper surface level of a gate structure adjacent to a side of the contact 120, while in the example embodiment illustrated in FIG. 6, the height H2 of the side insulating layer 280 may be lower than or similar to an upper surface level of a gate structure. In addition, a boundary surface between the upper region 224 and the lower region 225 may be formed to be disposed at substantially the same height as the upper surface of the side insulating layer 280.

A shape of the contact 220 in the example embodiments illustrated in FIG. 6 may be similar to that of the contact 120 according to the example embodiments illustrated in FIG. 5C, except for a ratio of a height of the upper region 224 to a height of the lower region 225. In some example embodiments, a maximum value W1 of a cross-sectional width of the upper region 224 may be greater than a maximum value W2 of a cross-sectional width of the lower region 225. A concave portion 228 may be formed between the upper region 224 and the lower region 225. The lower region 225 may include a first region 226 having a width increased away from an active region 210, and a second region 227 having a width decreased away from the active region 210. A width T1 of the side insulating layer 280 may be less than a width T2 of the second layer 222 in a position thereof in which the concave portion 228 is formed. In some example embodiments, the width T2 of the second layer 222 in the position thereof in which the concave portion 228 is formed may be twice or more the width T1 of the side insulating layer 280.

Figure 7:
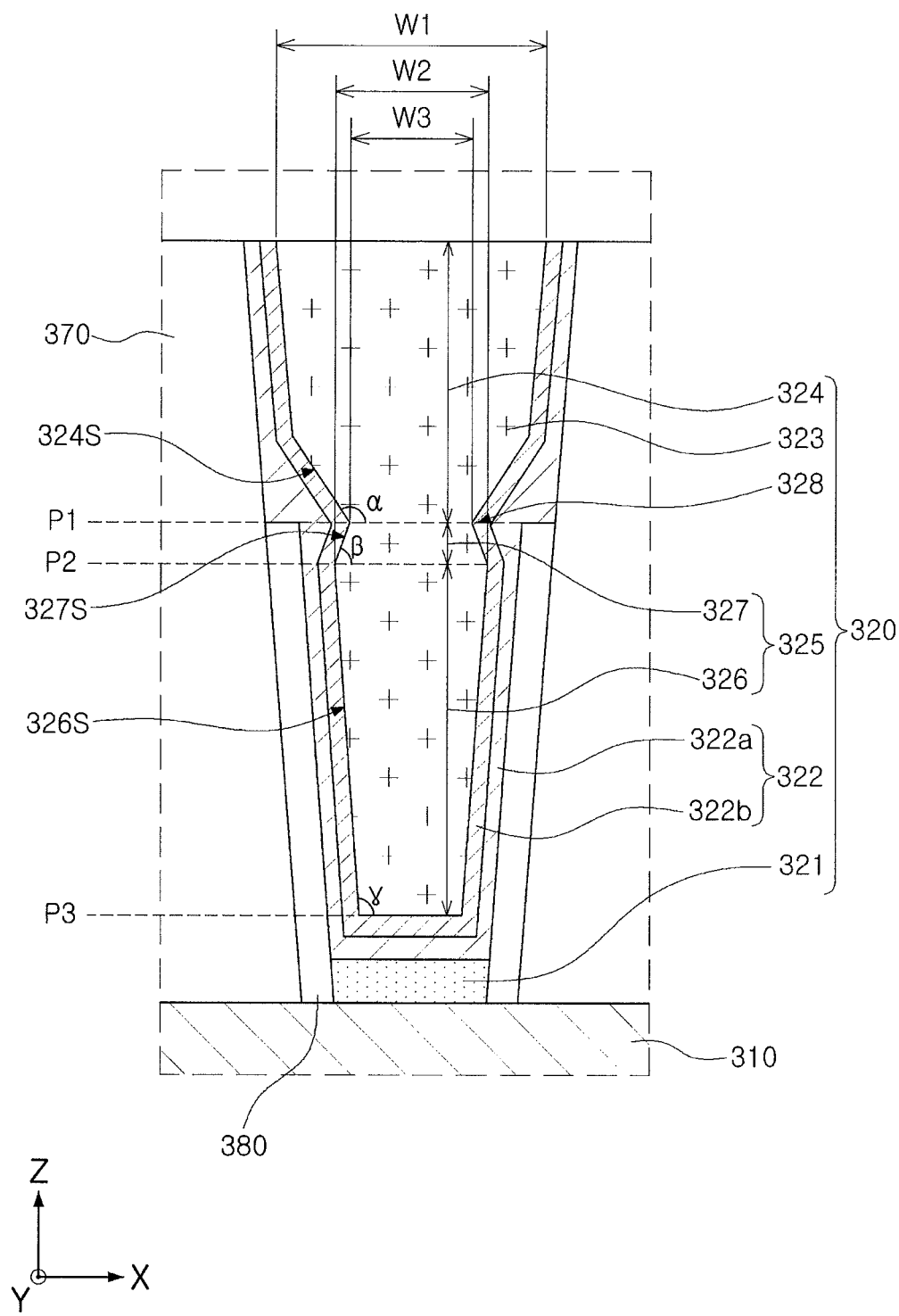

Referring to FIG. 7, in the case of a semiconductor device according to some example embodiments of the present inventive concept, a contact 320 may include a first layer 321, a second layer 322, and a third layer 323. The first layer 321 and the second layer 322 may be a metal silicide layer and a barrier metal layer, respectively, and the third layer 323 may be divided into an upper region 324 and a lower region 325. The lower region 325 may be divided into a first region 326 and a second region 327, depending on an angle of a side surface of the lower region 325, formed with respect to an X-Y plane parallel to an upper surface of a substrate.

Referring to FIG. 7, a first boundary surface P1 may be defined between the upper region 324 and the lower region 325. A second boundary surface P2 may be defined between the first region 326 and the second region 327 included in the lower region 325. A width W3 of the first boundary surface P1 may be less than a width W2 of the second boundary surface P2 and may be less than a width W1 of an upper surface of the upper region 324. A third boundary surface P3 may be defined as a plane between a lower surface of the third layer 323 and the second layer 322. In some example embodiments, the first boundary surface P1 may be formed at substantially the same height as an upper surface of a side insulating layer 380.

In some example embodiments illustrated in FIG. 7, the first boundary surface P1 and a side surface 324S of the upper region 324 may form a first angle (α), and the first angle (α) may be greater than 90 degrees. A side surface 327S of the second region 327 and the second boundary surface P2 may form a second angle (β) less than the first angle (β), and in some example embodiments, the second angle (β) may be less than 90 degrees. A side surface 326S of the first region 326 may form a third angle (γ) with the third boundary surface P3, and the third angle (γ) may be an acute angle, similarly to the first angle (α).

The side surface 324S of the upper region 324 and the side surface 327S of the second region 327 may be tilted in different directions with respect to the boundary surfaces P1 to P3 parallel to the upper surface of the substrate, for example, an X-Y plane, and thus, a concave portion 328 may be formed on the first boundary surface P1. In addition, as the side surface 327S of the second region 327 and the side surface 326S of the first region 326 are tilted in different directions with respect to the boundary surfaces P1 to P3, the lower region 325 may have a width that gradually increases and then decreases along direction away from an active region 310.

In the example embodiments illustrated in FIG. 7, the second layer 322 may include a plurality of layers 322a and 322b. For example, a lower layer 322a and an upper layer 322b may include the same or different materials. In some example embodiments, the lower layer 322a may be formed of one of titanium nitride (TiN), tantalum nitride (TaN), tungsten nitride (WN) and titanium (Ti), and the upper layer 322b may be formed of one of titanium nitride (TiN), tantalum nitride (TaN) and tungsten nitride (WN).

Figure 8:
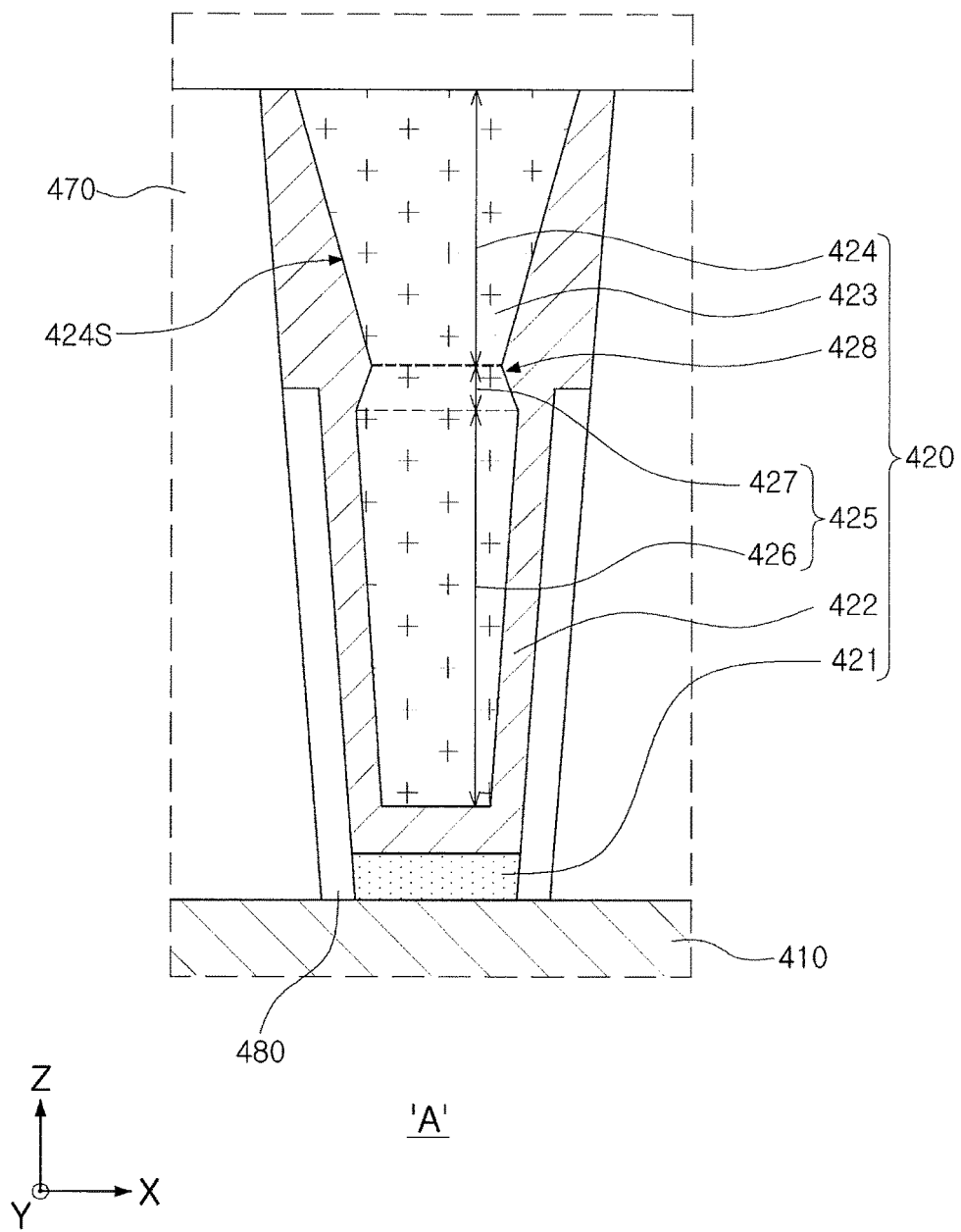

Referring to FIG. 8, in the case of a semiconductor device according to some example embodiments of the present inventive concept, a contact 420 may include a first layer 421, a second layer 422, and a third layer 423. The third layer 423 may be divided into an upper region 424 and a lower region 425. The lower region 425 may be divided into a first region 426 and a second region 427 by determining whether a width of the lower region 425 increases or decreases in a third direction, for example, a Z-axis direction.

In some example embodiments illustrated in FIG. 8, a boundary surface defined between the upper region 424 and the lower region 425 may be higher than an upper surface of a side insulating layer 480. In addition, a width of the upper region 424 may decrease toward an active region 410 in a third direction, for example, in a Z-axis direction. In this case, an inclination of the side surface 424S of the upper region 424 in the third direction, the Z-axis direction, may be substantially constant. Thus, a width of the upper region 424 to be decreased in the third direction, a Z-axis direction, may also be substantially constant.

FIGS. 9 to 34 are drawings illustrating operations for manufacturing a semiconductor device according to some example embodiments.

Figure 9:
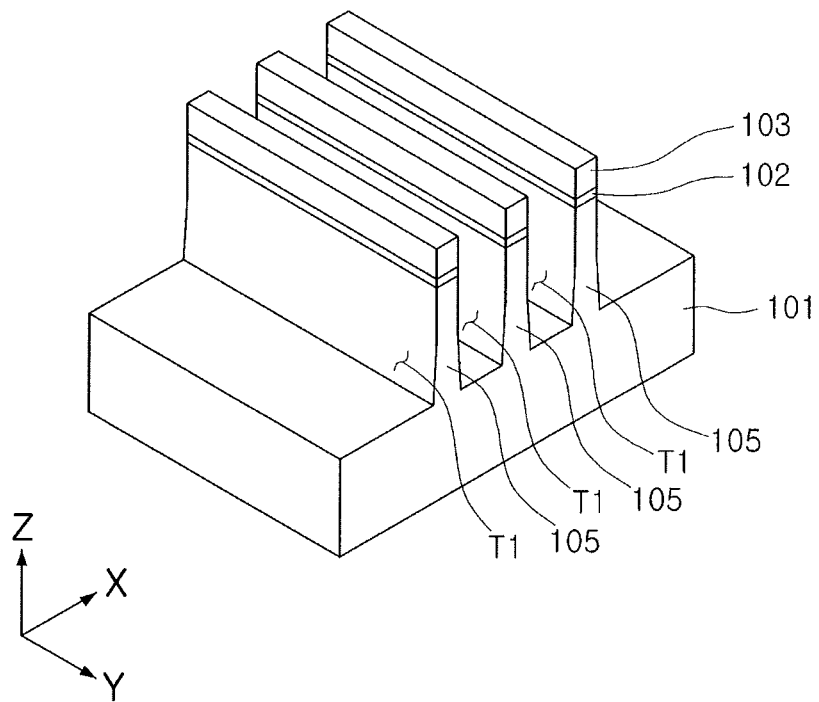
FIGS. 9 to 34 are drawings illustrating operations for manufacturing a semiconductor device according to some example embodiments of the present inventive concept.

Referring to FIG. 9, trenches T1 may be formed by etching a semiconductor substrate 101 in such a manner that a plurality of fin structures 105 may be defined by the trenches. The plurality of fin structures 105 may be arranged to provide an active region of a semiconductor device. The plurality of fin structures 105 may be formed to extend in a second direction, for example, a Y-axis direction.

In order to form the plurality of fin structures 105 and the trenches T1, a pad oxide pattern 102 and a mask pattern 103 may be formed on the semiconductor substrate 101. The pad oxide pattern 102 may be a layer provided to protect the plurality of fin structures 105, and may be omitted according to some example embodiments. The mask pattern 103 may be a mask layer for patterning of the semiconductor substrate 101, and may include silicon nitride, a carbon-containing material, and the like. The mask pattern 103 may also include a plurality of layers.

The semiconductor substrate 101 may be anisotropically etched using the pad oxide pattern 102 and the mask pattern 103, to thus form the trenches T1. For example, when the trenches T1 have a relatively high aspect ratio, a width of each of the trenches T1 may be reduced toward a lower portion thereof. In this case, the respective fin structures 105 may have a form in which a width thereof is reduced toward an upper portion thereof.

Figure 10:
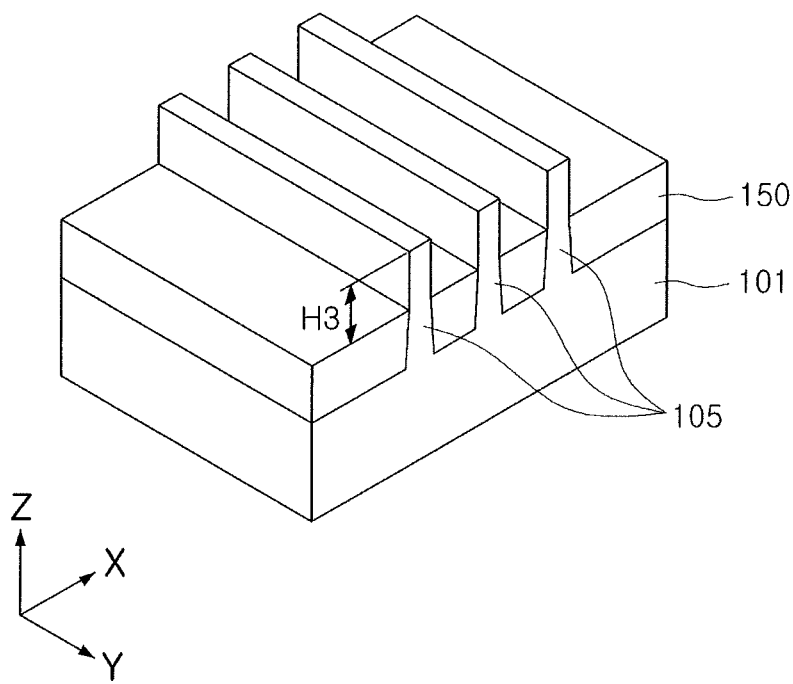

Referring to FIG. 10, an element isolation film 150 filling at least portions of the trenches T1 may be formed. In order to form the element isolation film 150, a process of filling the trenches T1 with an insulating material and then planarizing the insulating material may first be performed. During the planarization process, at least a portion of the pad oxide pattern 102 and the mask pattern 103 may be removed together with the planarized insulating material.

As the insulating material filling the trenches T1 is partially removed after the planarization process, the plurality of fin structures 105 may be exposed, thereby forming the element isolation film 150. The process of removing the insulating material may include a wet etching process in which the pad oxide pattern 102 is used as a mask. By partially removing the insulating material, the plurality of fin structures 105 may protrude by a predetermined height H3 as illustrated in FIG. 10. The pad oxide pattern 102 and the mask pattern 103 remaining on the plurality of fin structures 105 may be removed. The pad oxide pattern 102 may be removed together with the insulating material in the wet etching process to expose the plurality of fin structures 105.

Figure 11:
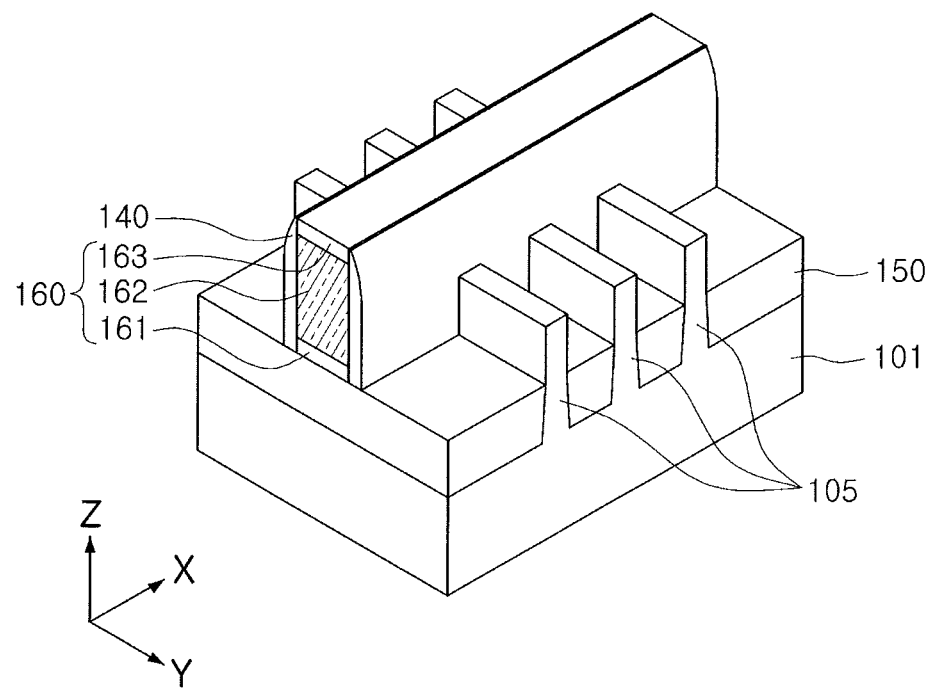

Referring to FIG. 11, a dummy gate structure 160 and a gate spacer 140 may be formed to transversely intersect the plurality of fin structures 105. The dummy gate structure 160 and the gate spacer 140 may extend in a first direction, for example, an X-axis direction.

The dummy gate structure 160 may include a dummy gate insulating layer 161, a dummy gate metal layer 162, a mask pattern layer 163, and the like. The dummy gate insulating layer 161 and the dummy gate metal layer 162 may be formed in an etching process using the mask pattern layer 163. The dummy gate insulating layer 161 may be formed of silicon oxide, and the dummy gate metal layer 162 may be formed of polysilicon.

The gate spacer 140 may be formed by forming a film of an insulating material on the dummy gate structure 160, the plurality of fin structures 105 and the element isolation film 150, and then anisotropically etching the film. The gate spacer 140 may include silicon oxide, silicon nitride, silicon oxynitride, or the like.

Figure 12:
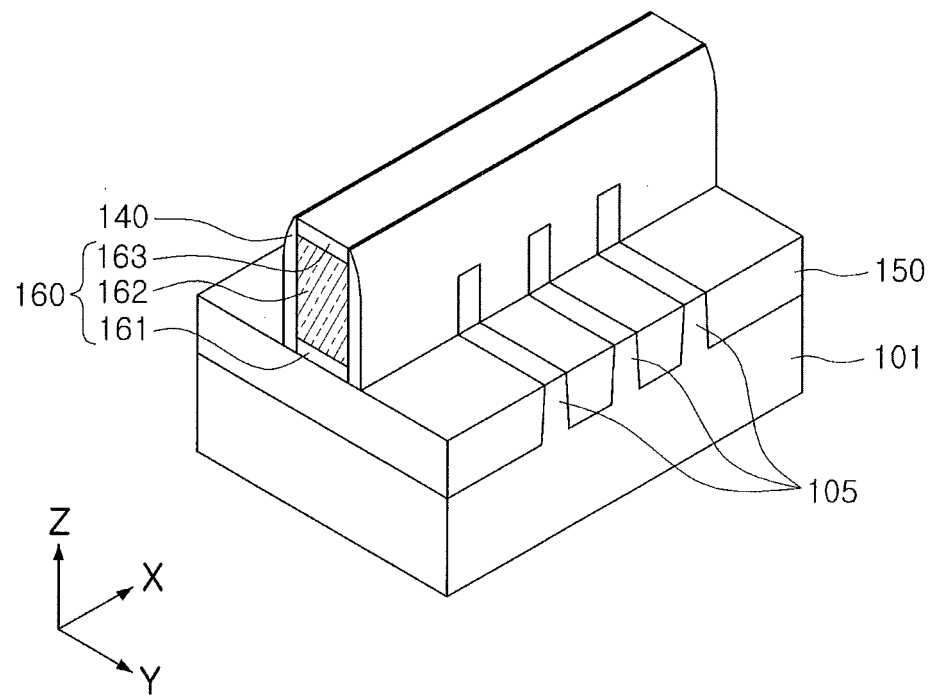

Referring to FIG. 12, the plurality of fin structures 105 on two sides of the gate spacer 140 may be selectively removed. Recesses may be formed by removing the fin structures 105 from two sides of the gate spacer 140. The recesses may be formed by forming a separate mask layer or etching the fin structures 105 by using the mask pattern layer 163 and the gate spacer 140 as masks. In some example embodiments, the recesses may be formed by sequentially performing a dry etching process and a wet etching process.

Selectively, after the recesses are formed, a process of curing surfaces of the fin structures 105 recessed through a separate process may also be performed. The example embodiment of FIG. 12 illustrates that upper surfaces of the recessed fin structures 105 are coplanar with an upper surface of the element isolation film 150, but is not limited thereto. In other example embodiments, the upper surfaces of the recessed fin structures 105 may be higher or lower than an upper surface of the element isolation film 150.

Figure 13:
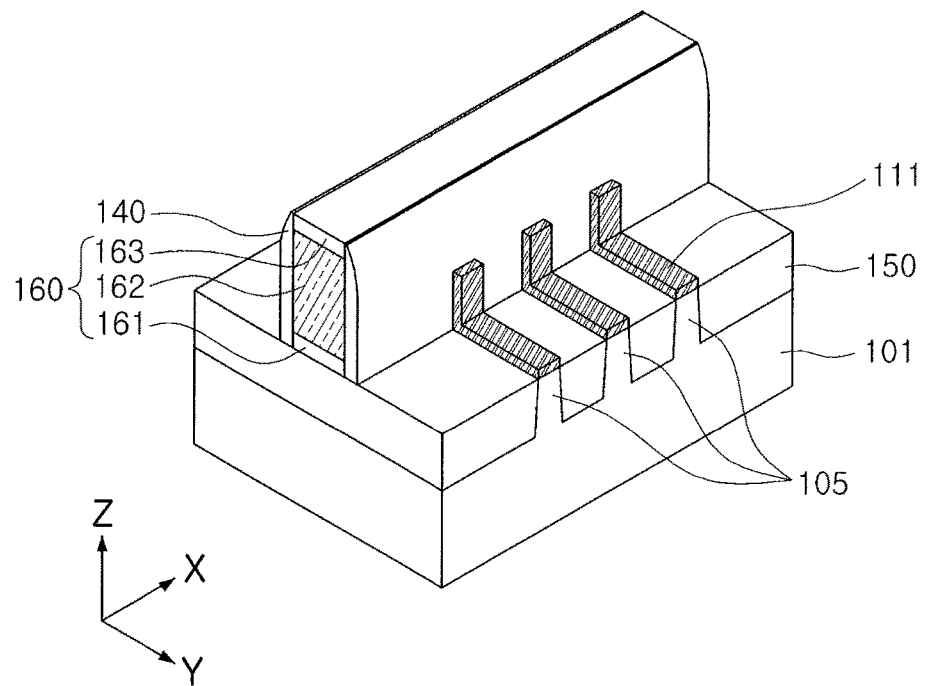

Referring to FIG. 13, first regions 111 of an active region 110 may be formed on the recessed fin structures 105 on two sides of the gate spacer 140. To form the active region 110 described with reference to FIGS. 13 and 14, for example, a selective epitaxial growth (SEG) process may be used.

The active region 110 may be formed using, for example, silicon (Si) or silicon-germanium (SiGe). For example, when the active region 110 includes silicon germanium (SiGe), since the silicon-germanium (SiGe) is grown on the fin structures 105 formed of silicon (Si), compressive stress may occur. The first region 111 may serve as a buffer layer to suppress the occurrence of defects caused by a difference in lattice constants between the fin structures 105 and silicon-germanium (SiGe), and may include a relatively low first concentration of germanium (Ge).

Figure 14:
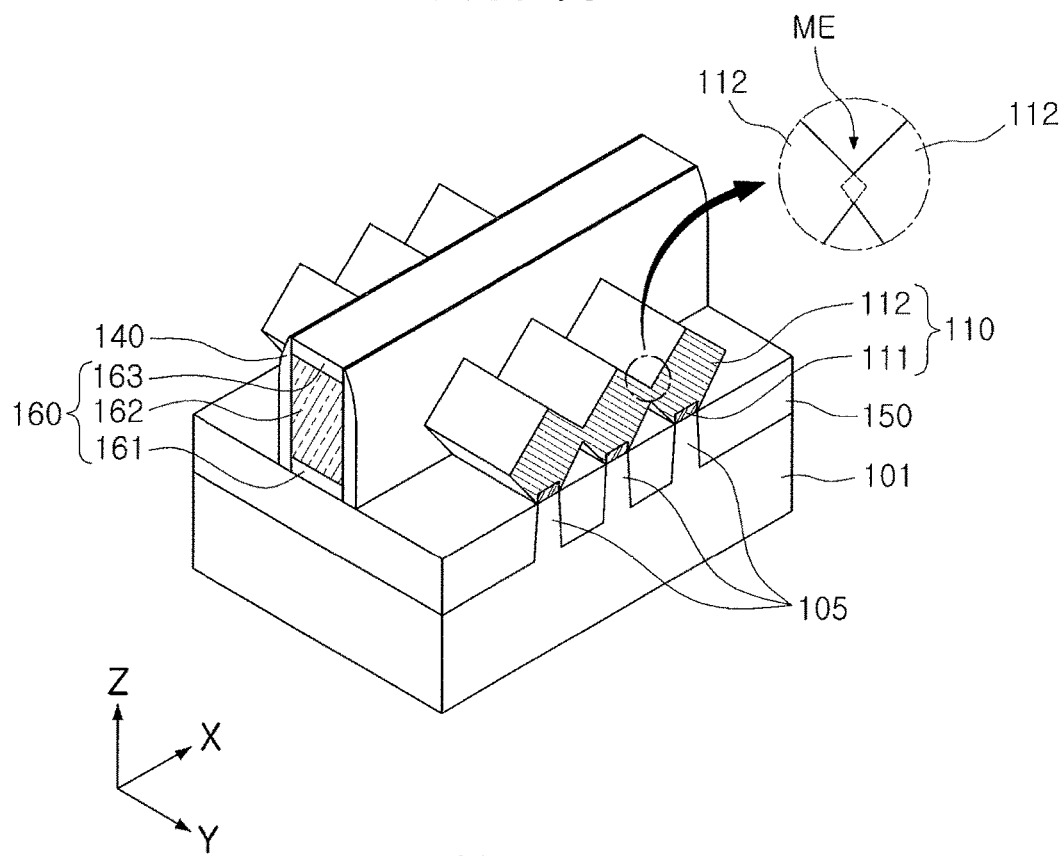

Referring to FIG. 14, second regions 112 may be formed on the first regions 111 of the active region 110.

The second regions 112 may be connected to each other in a growth process to form a connection portion ME. The second regions 112 may grow along crystallographically stable planes in a growth process to have a pentagonal or hexagonal shape as illustrated in FIG. 14. Thus, a surface of the second region 112 may have an inclined angle with respect to the semiconductor substrate 101. As described above, when the surface of the second region 112 is grown as a crystallographically stable surface, the growth thereof may not occur further, even after a growth time has elapsed after growth of a certain amount.

For example, when the active region 110 includes silicon-germanium (SiGe), the second region 112 may include a higher concentration of germanium (Ge) than that of the first region 111. The active region 110 may include an n-type impurity or a p-type impurity depending on the type of the semiconductor device to be manufactured, and impurity concentrations of the first region 111 and the second region 112 may also be different from each other.

Figure 15:
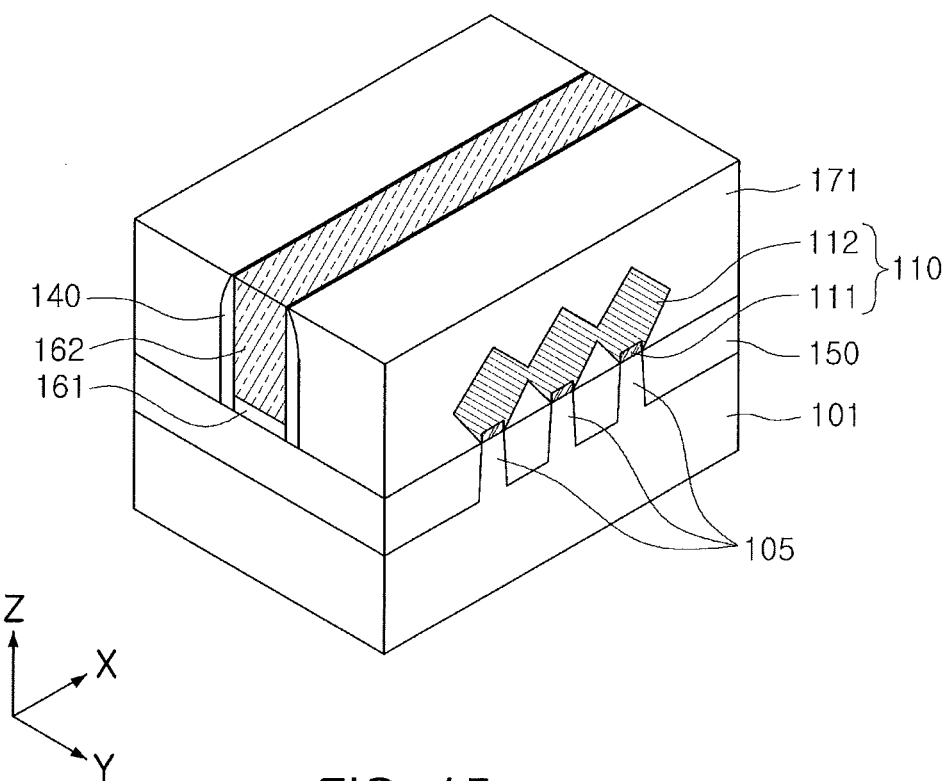

Referring to FIG. 15, a first interlayer insulating layer 171 may be formed to cover the active region 110. After forming a layer covering the dummy gate structure 160 and the active region 110 with an insulating material, a planarization process may be performed to expose an upper surface of the dummy gate metal layer 162, thereby forming the first interlayer insulating layer 171. For example, in the process of forming the first interlayer insulating layer 171, the mask pattern layer 163 may be removed. The first interlayer insulating layer 171 may include at least one of silicon oxide, silicon nitride, and silicon oxynitride.

Figure 16:
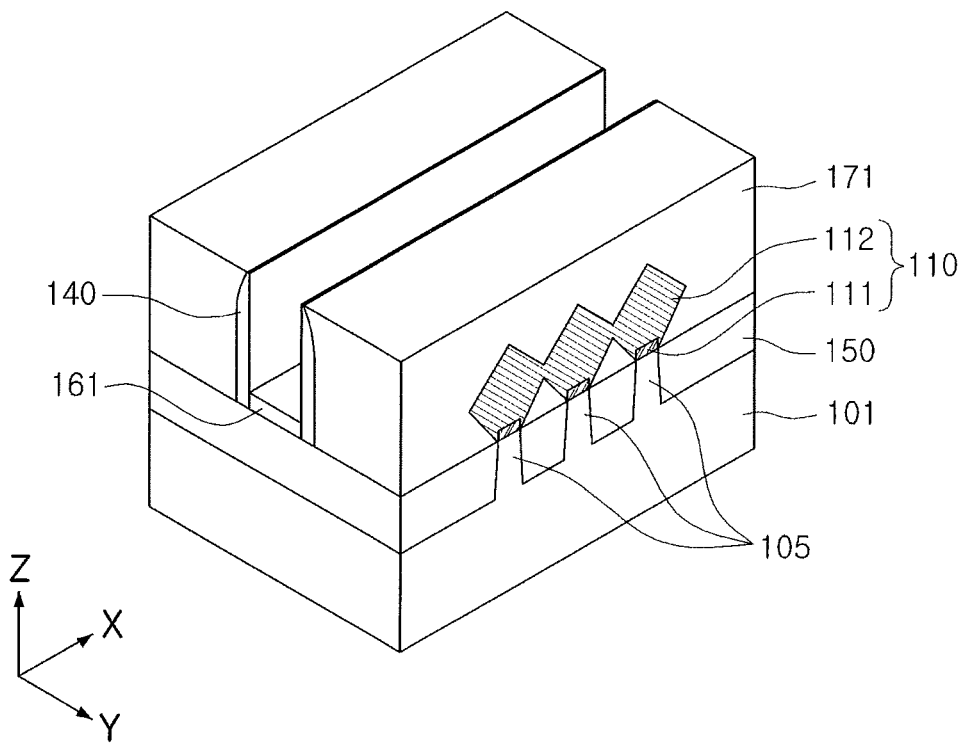

Referring to FIG. 16, the dummy gate metal layer 162 and the dummy gate insulating layer 161 may be removed. In the process in which the dummy gate metal layer 162 and the dummy gate insulating layer 161 are removed, the gate spacer 140 and the fin structures 105 may remain. Thus, as in the example embodiment illustrated in FIG. 16, a space in which a gate structure is to be formed may be provided between the gate spacer 140 and the gate spacer 140, and at least portions of the fin structures 105 may be exposed through the space. According to some example embodiments, the dummy gate metal layer 162 and the dummy gate insulating layer 161 may be simultaneously removed.

Figure 17:
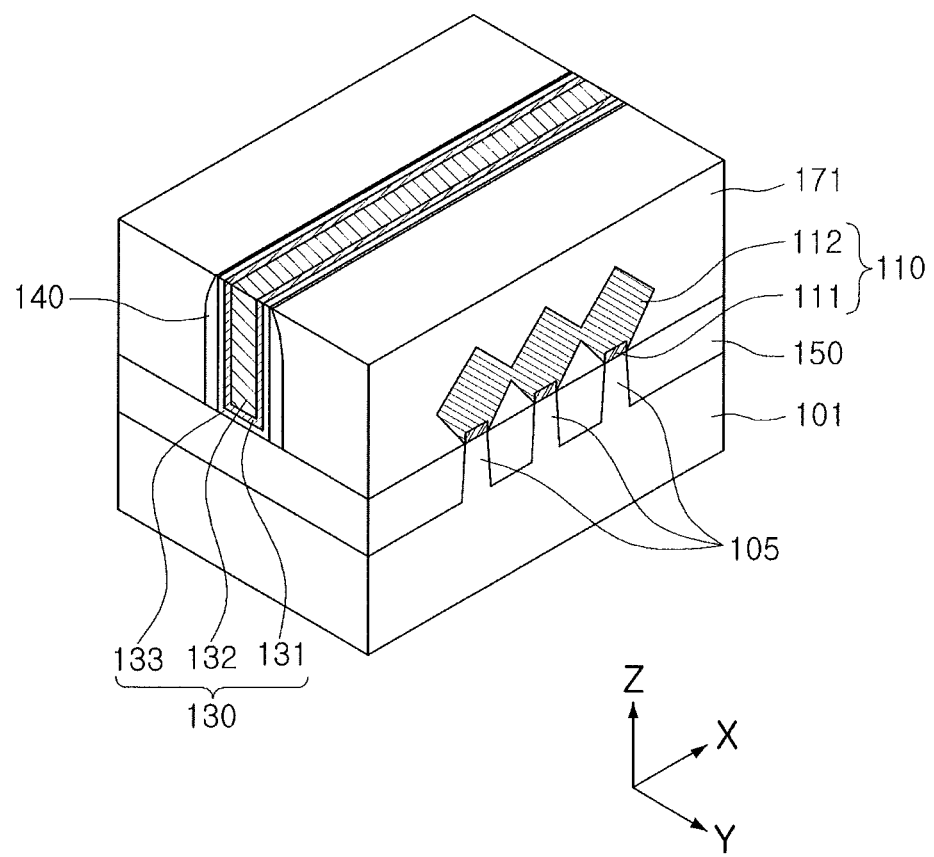

Referring to FIG. 17, a gate structure 130 may be formed in the space between the gate spacers 140. The gate structure 130 may include a first gate metal layer 131, a second gate metal layer 132, and a gate insulating layer 133. The gate insulating layer 133 may conform to inner side surfaces and a bottom surface of the space formed between the gate spacers 140, and may include an oxide, a nitride, or a high-k material. Thus, the gate insulating layer 133 may be formed on inner sides of the gate spacer 140, and on an externally exposed upper surface of the semiconductor substrate 101, and upper surfaces of the fin structures 105.

The first and second gate metal layers 131 and 132 may include a metal or a semiconductor material. In some embodiments, the first and second gate metal layers 131 and 132 may include different materials. The first gate metal layer 131 may function as a barrier metal layer for diffusion prevention, and may include titanium nitride (TiN), or the like. The second gate metal layer 132 may be formed of a metal such as tungsten (W), copper (Cu), or molybdenum (Mo), or the like, or may be formed of polysilicon. According to some example embodiments, another metal layer may be further provided between the first gate metal layer 131 and the second gate metal layer 132.

Figure 18:
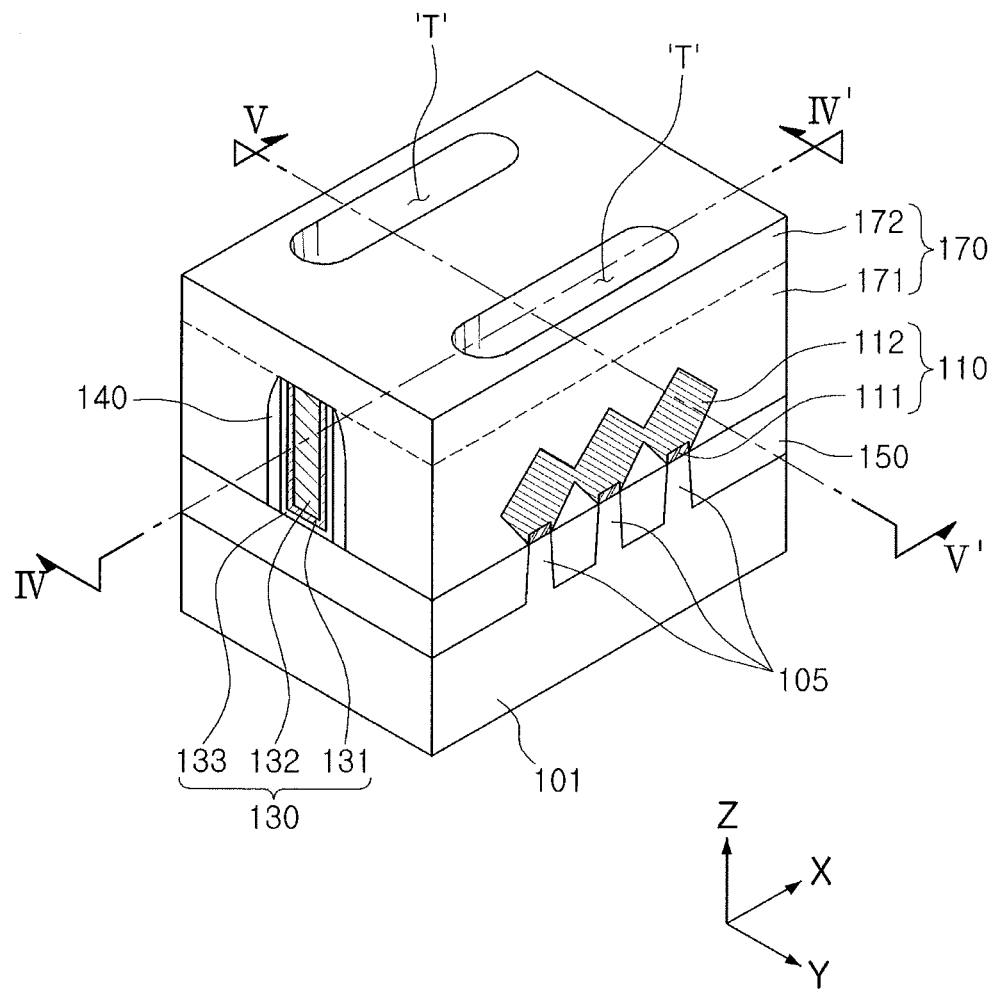

Referring to FIG. 18, a second interlayer insulating layer 172 may be formed on the first interlayer insulating layer 171, and a trench T penetrating through an interlayer insulating layer 170 may be formed. The second interlayer insulating layer 172 may include an insulating material similarly to the case of the first interlayer insulating layer 171, and the trench T may be respectively formed on two sides of the gate structure 130.

The trench T may be formed by removing a portion of the interlayer insulating layer 170 by using a separate mask layer such as a photoresist pattern. The trench T may have a length and a width shorter than those of the active region 110 in a first direction, an X-axis direction, and a second direction, a Y-axis direction, respectively. A portion of an upper surface of the active region 110 may be exposed in the trench T, and a portion of the active region 110 may be removed together when the trench T is formed, according to some example embodiments. Hereinafter, operations in FIGS. 19 and 20 will be described.

Figure 19:
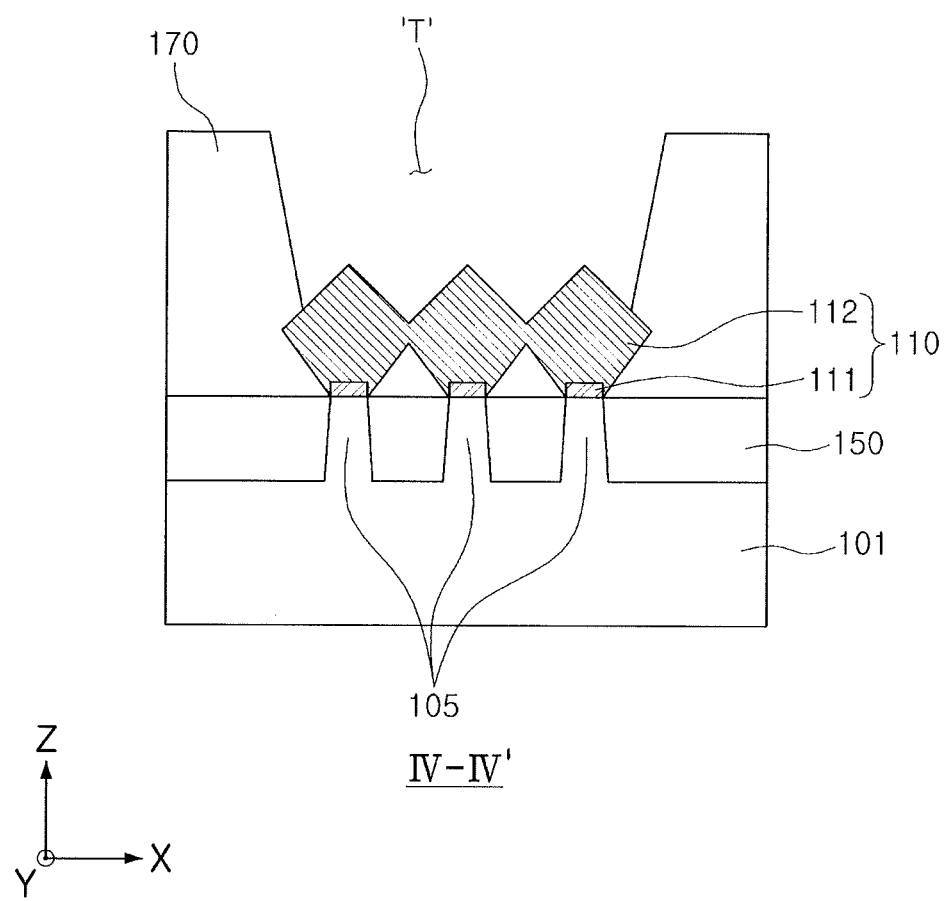
Figure 20:
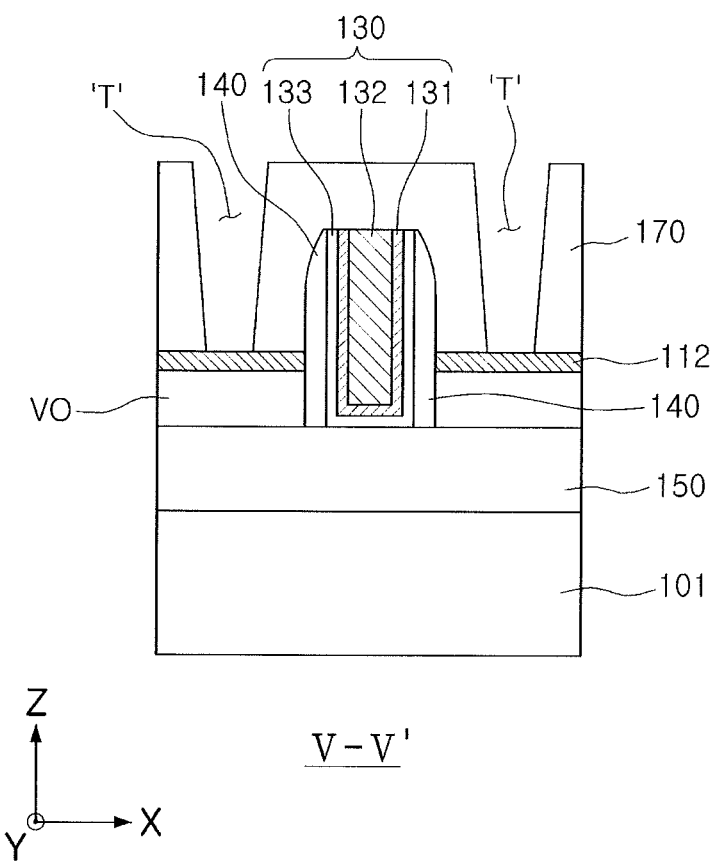

FIGS. 19 and 20 are cross-sectional views taken along lines IV-IV' and V-V' of FIG. 18. Referring to FIGS. 19 and 20, the trench T may have a shape in which a width thereof is reduced toward the active region 110. For example, when a portion of the active region 110 is removed during the process of forming the trench T, the active region 110 may also have an upper surface more planarized than an upper surface of the active region 110 illustrated in FIGS. 19 and 20. In some example embodiments, a space between the second region 112 of the active region 110 and the element isolation film 150 may not be filled with the interlayer insulating layer 170. Thus, a vacant space VO may be formed between the second region 112 and the element isolation film 150.

Figure 21:
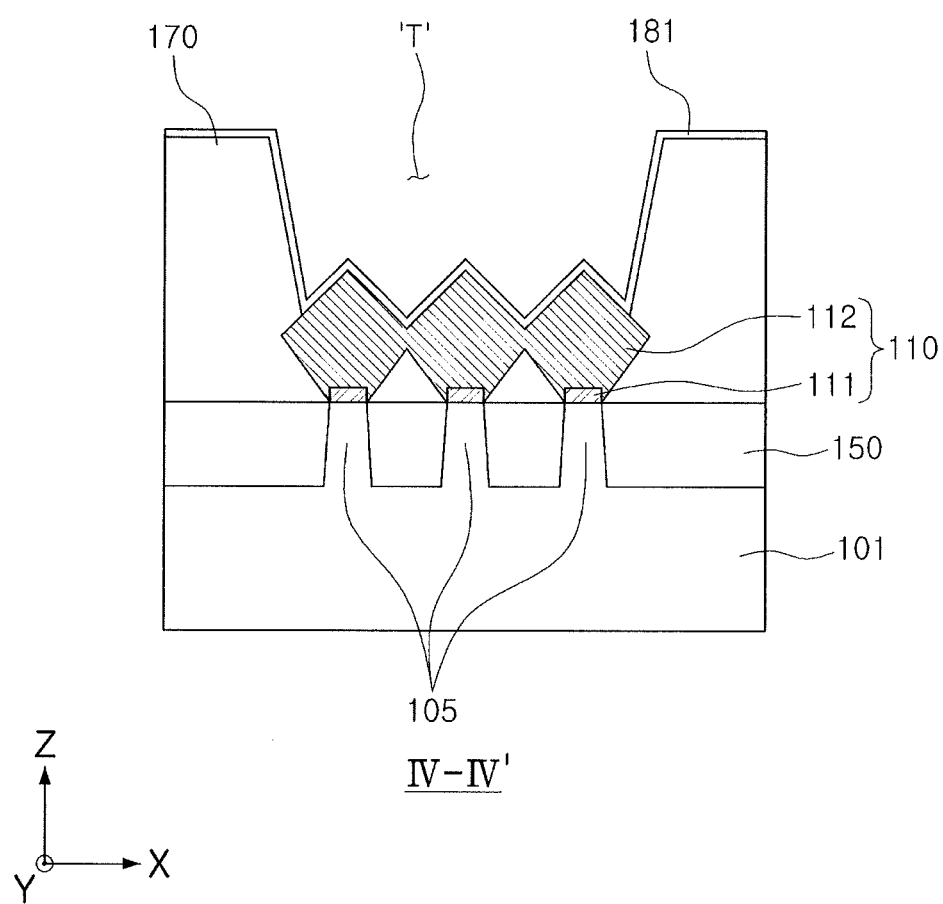
Figure 22:
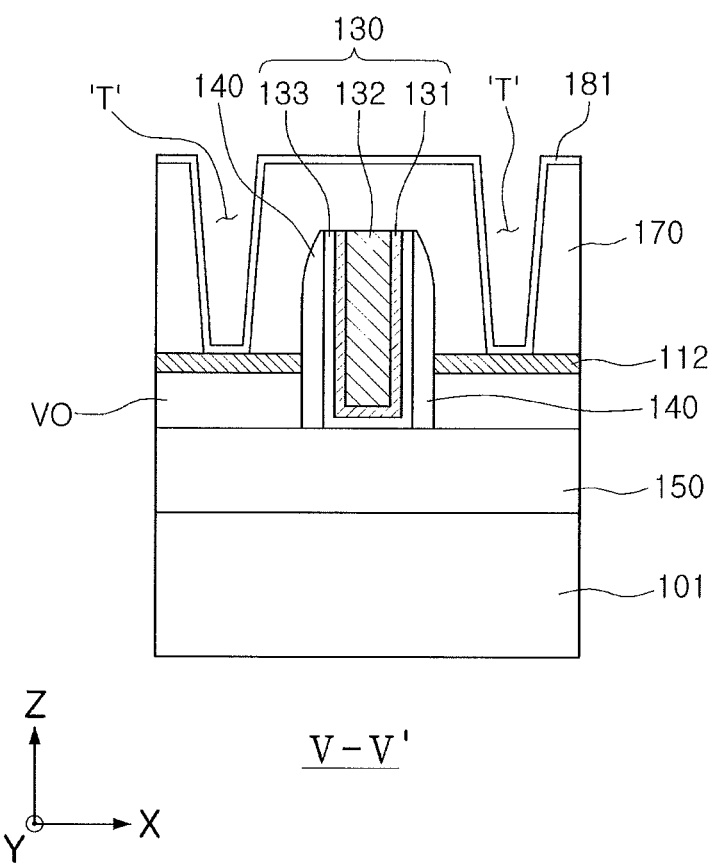

Referring to FIGS. 21 and 22, an inner insulating layer 181 may be formed in the trench T. The inner insulating layer 181 may be formed of silicon nitride, and conformally formed in the trench T. Thus, the inner insulating layer 181 may be formed on an inner side of the trench T and an upper surface of the active region 110, exposed in the trench T. After the inner insulating layer 181 is formed, a space may remain in the trench T.

Figure 23:
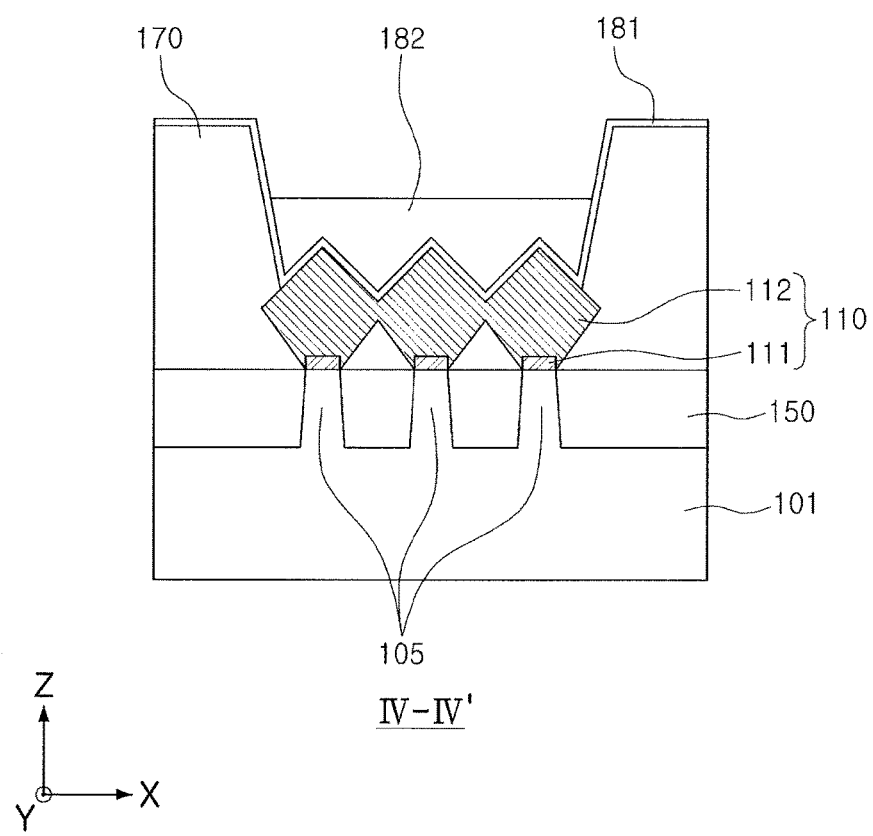
Figure 24:
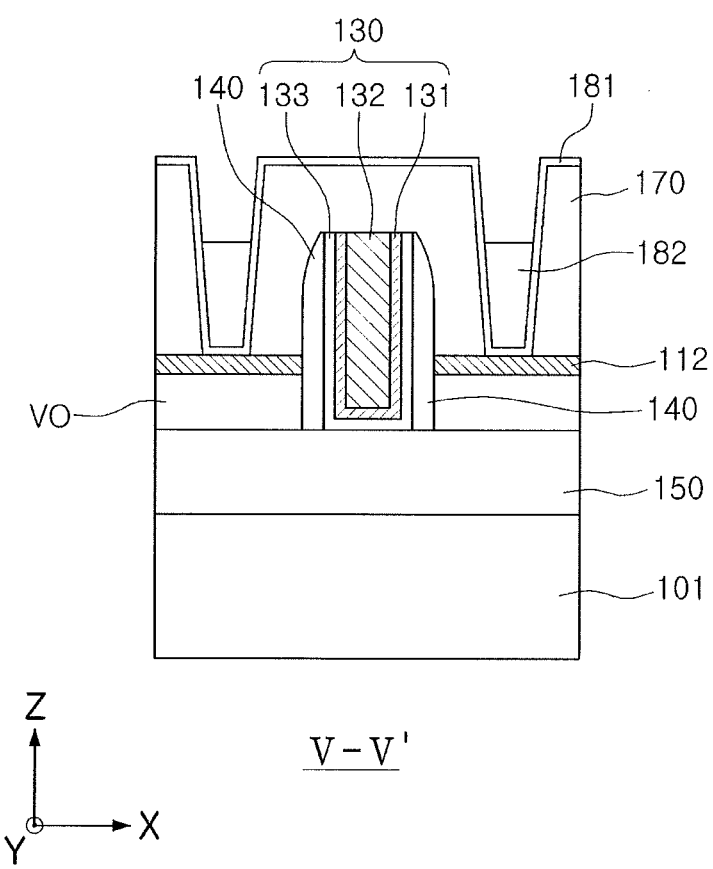

Referring to FIGS. 23 and 24, a spin-on hardmask (SOH) layer 182 may be formed in an inner space of the inner insulating layer 181. The SOH layer 182 may include carbon, and an upper surface of the SOH layer 182 may be positioned lower than an upper surface of the interlayer insulating layer 170. For example, the SOH layer 182 may be formed in the inner insulating layer 181 in such a manner that it may not completely fill the inner space of the inner insulating layer 181.

Figure 25:
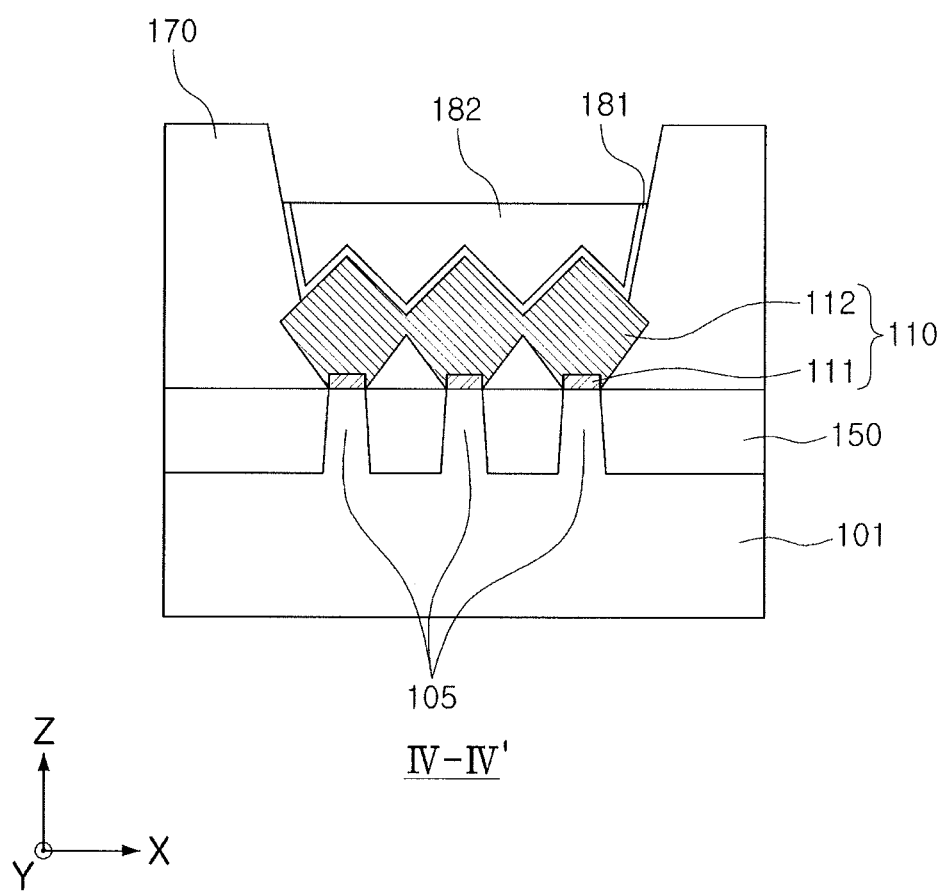
Figure 26:
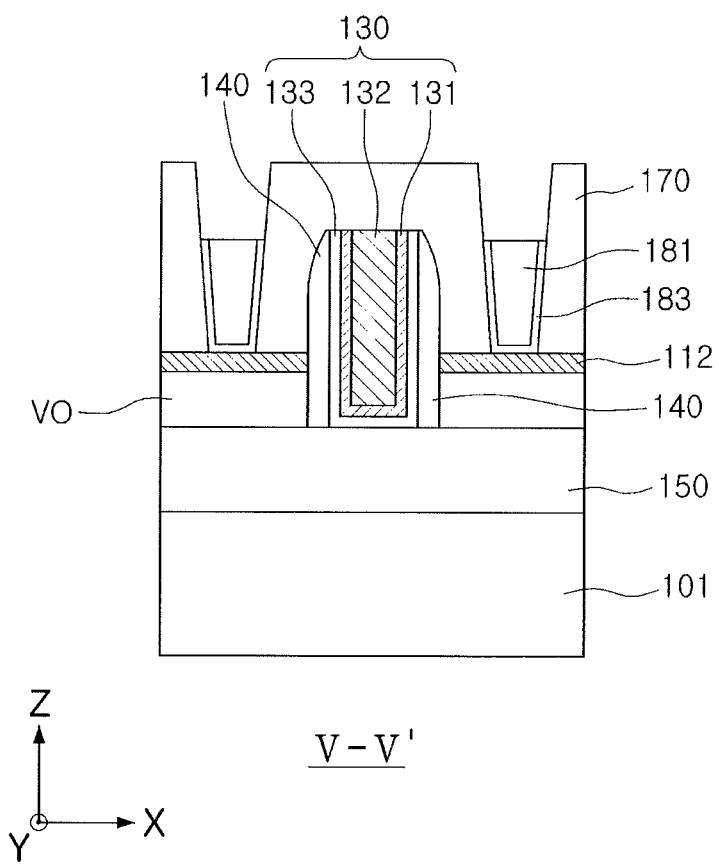

Referring to FIGS. 25 and 26, a portion of the inner insulating layer 181 may be removed above the upper surface of the SOH layer 182. An upper surface of the inner insulating layer 181 may be coplanar with the upper surface of the SOH layer 182 in the process according to the example embodiment illustrated in FIGS. 25 and 26.

Figure 27:
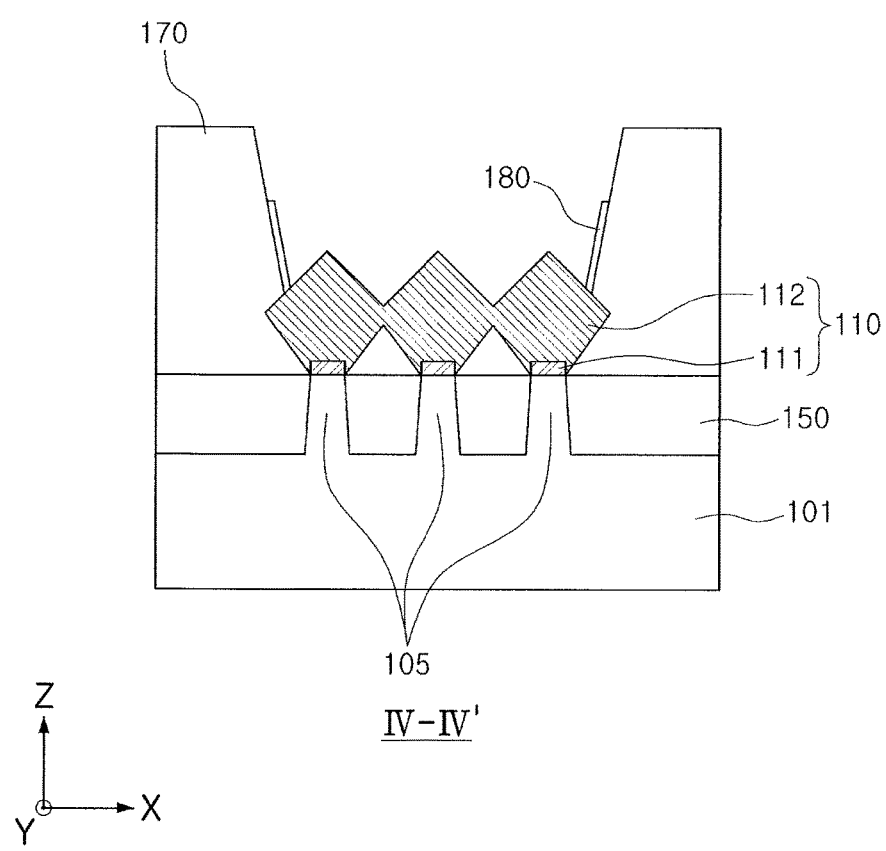
Figure 28:
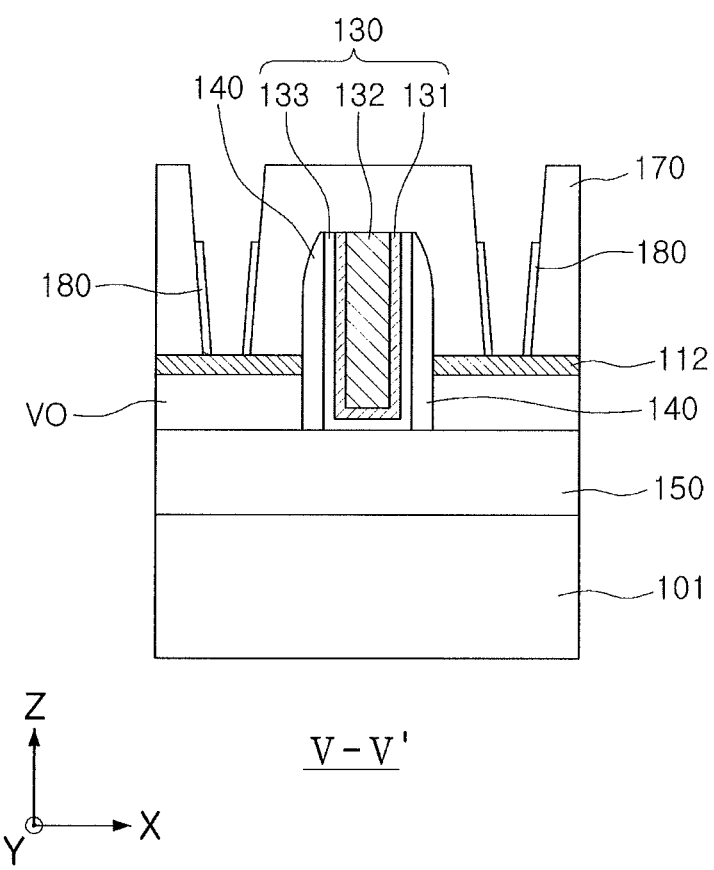

With reference to FIGS. 27 and 28, the SOH layer 182 may be removed. After the SOH layer 182 is removed, at least a portion of the inner insulating layer 181 formed on the upper surface of the active region 110 may be removed to form the side insulating layer 180. Thus, the side insulating layer 180 may only be formed on an inner side surface of the trench T formed in the interlayer insulating layer 170, and an upper surface of the active region 110 may be exposed.

A height of the side insulating layer 180 may be determined by a height of the SOH layer 182 formed in the process described above with reference to FIGS. 23 and 24. Although FIG. 28 illustrates that a height of the side insulating layer 180, for example, an upper surface level thereof, is lower than a height of the gate structure 130, an upper surface level thereof, an example embodiment of the present inventive concept is not limited thereto. For example, the upper surface of the side insulating layer 180 may be positioned higher than the upper surface of the gate structure 130, and the upper surface of the side insulating layer 180 and the upper surface of the gate structure 130 may be located at substantially the same height.

According to some example embodiments, a cleaning process may be performed after the SOH layer 182 is removed. By the cleaning process, a portion of the interlayer insulating layer 170 exposed upwardly from the side insulating layer 180 may be removed, and thus, a width of an upper portion of the trench T may be increased.

Figure 29:
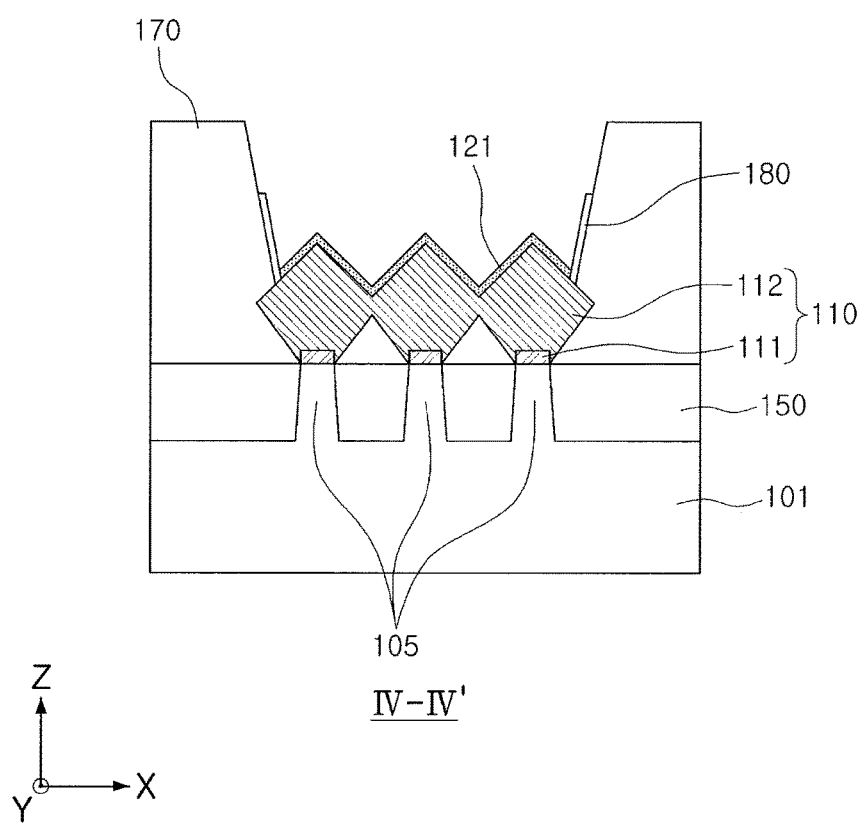
Figure 30:
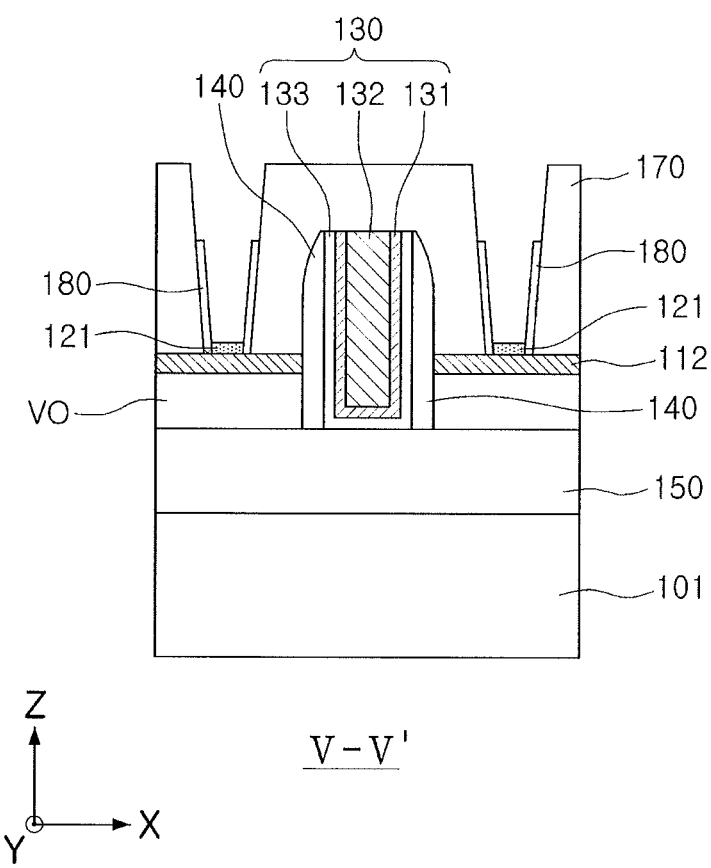

Then, referring to FIGS. 29 and 30, a first layer 121 may be formed on an upper surface of the exposed portion of the active region 110. The first layer 121 may be a metal silicide layer, and may be formed by depositing a metal material on the upper surface of the active region 110 and performing a silicidation process, such as a heat treatment, laser annealing, or the like thereon. In some example embodiments, the first layer 121 may be a layer formed as titanium (Ti), cobalt (Co), nickel (Ni), tungsten (W), copper (Cu), tantalum (Ta), platinum (Pt), hafnium (Hf), molybdenum (Mo), radium (Ra), or an alloy thereof reacts with silicon (Si).

Figure 31:
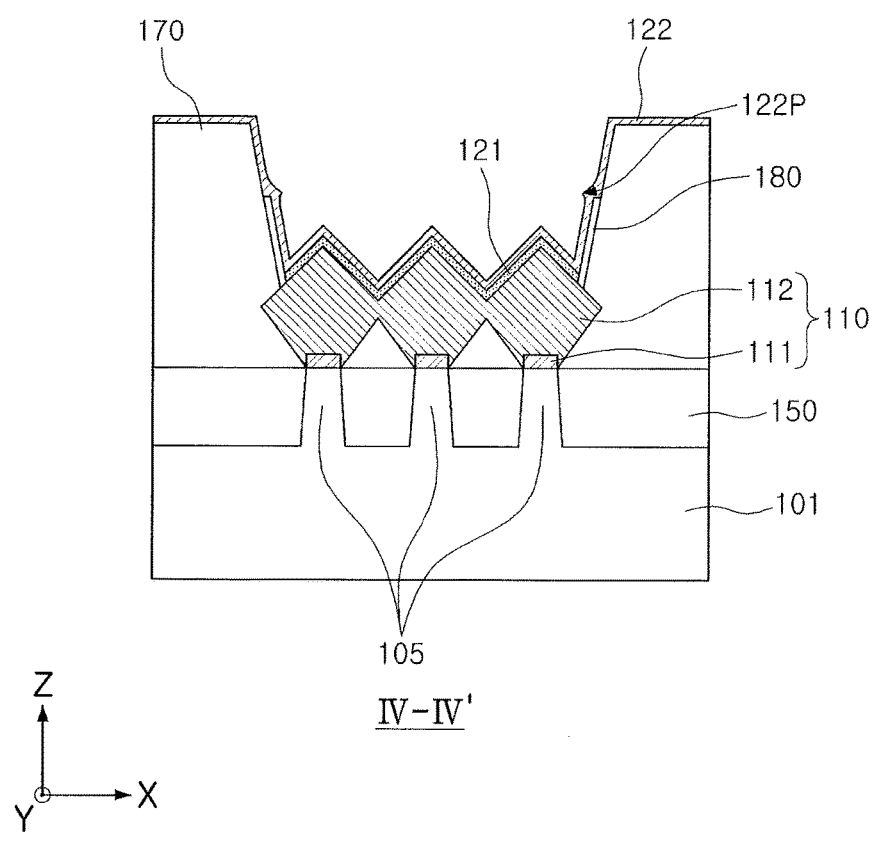
Figure 32:
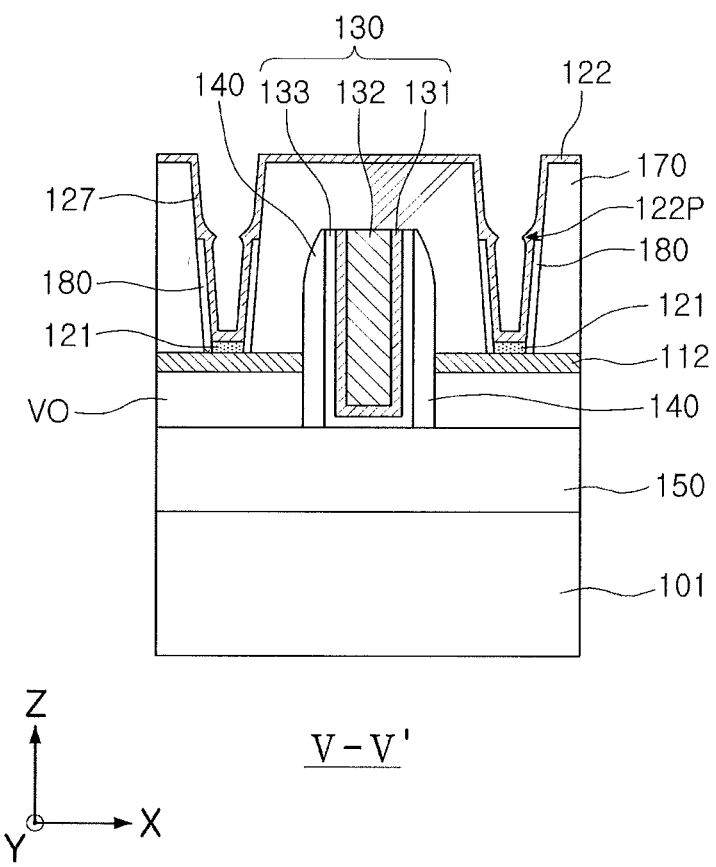

Referring to FIGS. 31 and 32, after the first layer 121 is formed, a second layer 122 may be formed. In some example embodiments, the second layer 122 may be a barrier metal layer formed of titanium nitride (TiN), tantalum nitride (TaN), tungsten nitride (WN), or the like, and may be formed by a physical vapor deposition (PVD) process. Thus, as illustrated in FIGS. 31 and 32, the second layer 122 may have a protrusion 122P in a region thereof adjacent to a corner at which an upper surface and a side of the side surface insulating layer 180 meet each other.

Figure 33:
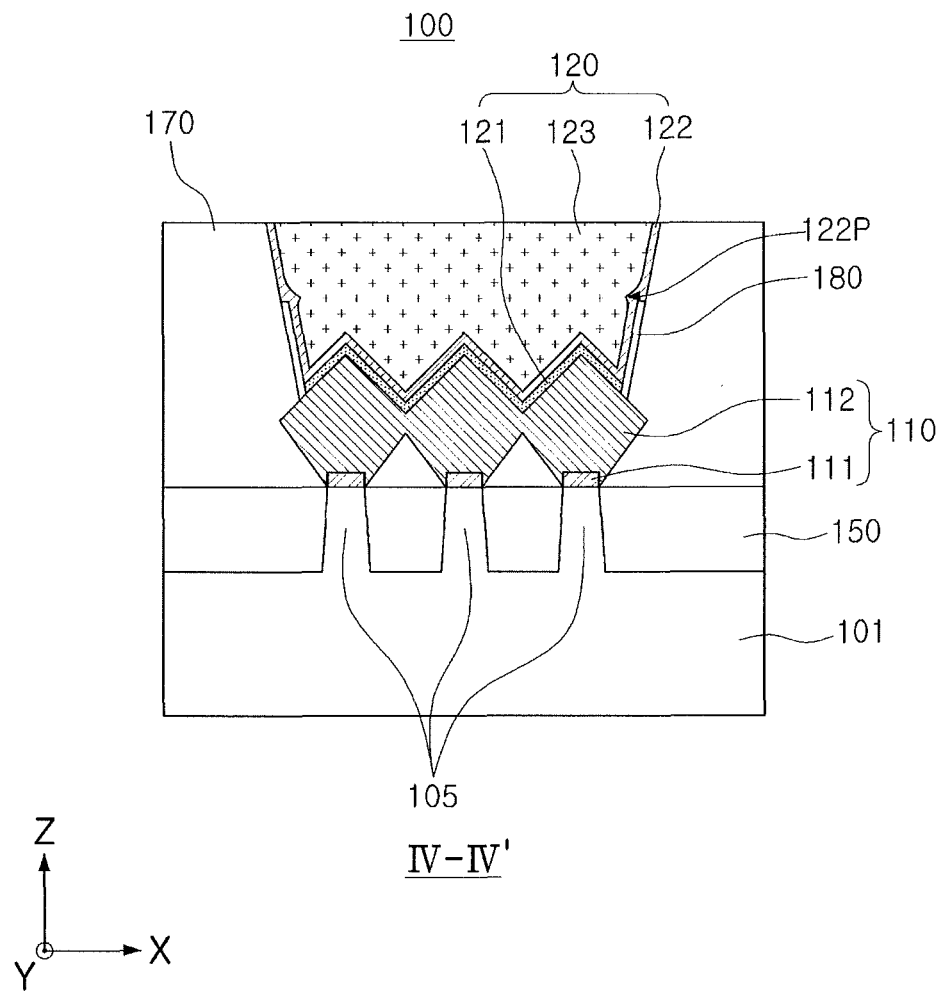
Figure 34:
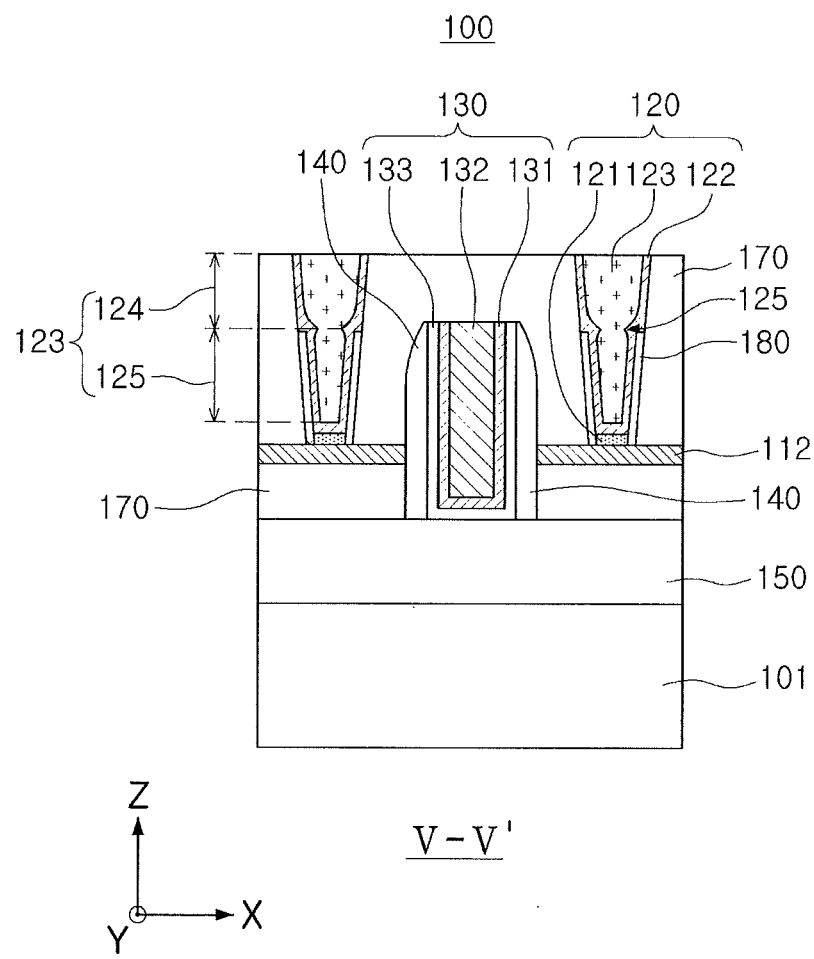

Referring to FIGS. 33 and 34, a third layer 123 may be formed on the second layer 122. The third layer 123 may fill a space inside the second layer 122, and an upper surface of the third layer 123 may be coplanar with the upper surface of the interlayer insulating layer 170. The third layer 123 may be formed of a metal, such as tungsten (W), aluminum (AL), molybdenum (Mo), or the like.

Since the third layer 123 fills the space surrounded by the second layer 122, the third layer 123 may have a concave portion 128 corresponding to the protrusion 122P formed on the second layer 122. The concave portion 128 may be formed adjacent a corner at which the upper surface and the side of the side surface insulating layer 180 meet. Since the concave portion 128 corresponds to the protrusion 122P of the second layer 122, a position in which the concave portion 128 is provided may be determined according to a height of the side insulating layer 180.

Referring to FIG. 34, the third layer 123 may include an upper region 124 and a lower region 125, based on the concave portion 128. In some example embodiments, the upper region 124 may have a width that is gradually reduced toward an upper surface of the substrate 101 in a third direction, a Z-axis direction, while the lower region 125 may have a width that increases and then decreases along a third direction toward the upper surface of the substrate 101 in the third direction (the Z-axis direction).

The contact 120 of the semiconductor device 100 according to the example embodiment described with reference to FIGS. 9 to 34 may have a greatest width near an upper surface thereof. Thus, the alignment and a connection process of a metal line and the like provided on the contact 120, and the contact 120, may be further facilitated, which may reduce a defect rate in a manufacturing process and improving efficiency thereof. However, the structure and shape of the contact 120 applicable to the semiconductor device 100 according to some example embodiments of the present inventive concept may be variously changed as described above with reference to FIGS. 5 to 8.

Figure 35:
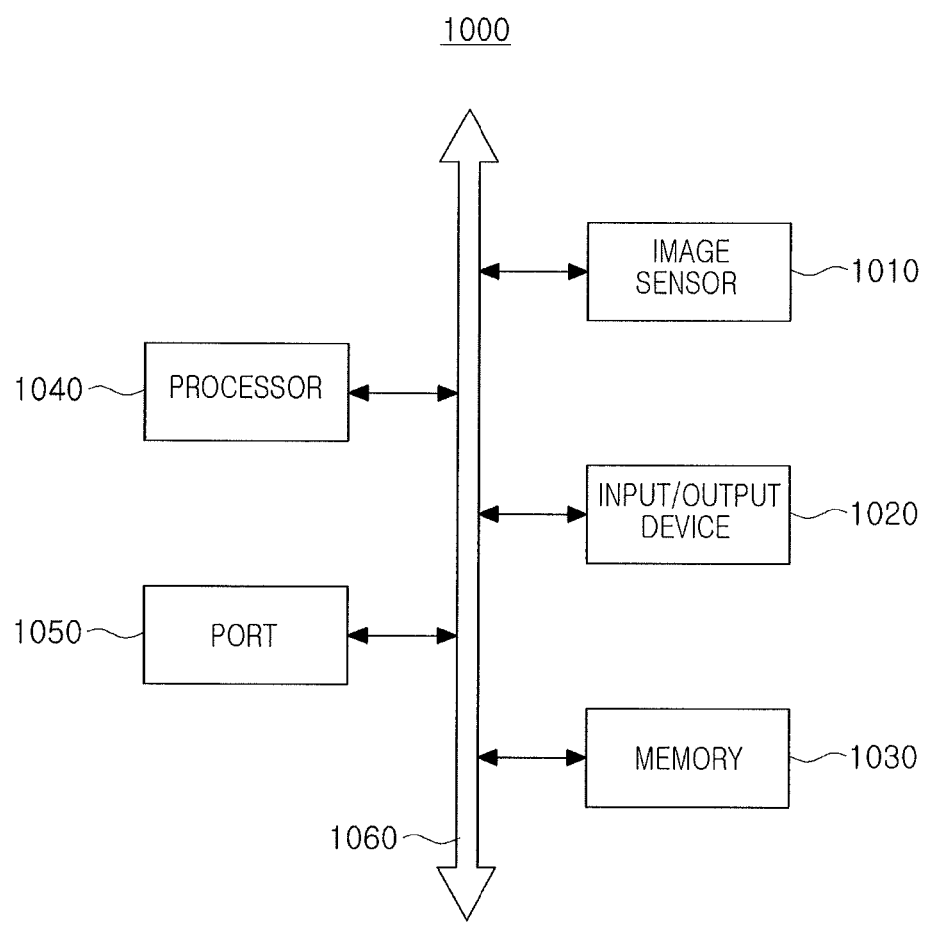
FIG. 35 is a block diagram of an electronic device including a memory device according to some example embodiments of the present inventive concept.

FIG. 35 is a block diagram of an electronic device including a semiconductor device according to some example embodiments of the present inventive concept.

Referring to FIG. 35, a semiconductor device according to various example embodiments of the present inventive concept may be applied to a computer apparatus 1000. The computer apparatus 1000 according to the example embodiment illustrated in FIG. 35 may include an image sensor 1010, an input/output device 1020, a memory 1030, a processor 1040, a port 1050, and the like. The semiconductor device according to the example embodiment may be applied to the image sensor 1010, the memory 1030, the processor 1040, and the like. In addition, the computer apparatus 1000 may further include a wired/wireless communications device, a power supply device, and the like.

Among constituent elements illustrated in FIG. 35, the port 1050 may be a device provided to allow the computer apparatus 1000 to communicate with a video card, a sound card, a memory card, a USB device, and the like. The computer apparatus 1000 may be a comprehensive concept including a smartphone, a tablet PC, a smart wearable device, and the like, as well as a general desktop computer and a laptop computer.

The processor 1040 may perform specific arithmetic operations, commands, tasks, and the like. The processor 1040 may be a central processing unit (CPU) or a microprocessor unit (MCU), and may communicate with the memory 1030, the input/output device 1020, the image sensor 1010, and other devices connected to the port 1050, via a bus 1060.

The memory 1030 may be a storage medium storing data required for operations of the computer apparatus 1000, multimedia data, or the like. The memory 1030 may include a volatile memory, such as a random access memory (RAM), or a non-volatile memory, such as a flash memory and the like. In addition, the memory 1030 may include at least one of a solid state drive (SSD), a hard disk drive (HDD), and an optical drive (ODD), as a storage device. The input/output device 1020 may include an input device such as a keyboard, a mouse, a touchscreen, and the like for a user, and an output device such as a display, an audio output unit, and the like.

The image sensor 1010 may include a sensor circuit containing a plurality of transistors, and the sensor circuit may be implemented by the semiconductor device according to some example embodiments. Further, the semiconductor device according to some example embodiments may be applied to circuits included in the processor 1040, the memory 1030, or the like.

As set forth above, in the case of a semiconductor device according to some example embodiments of the present inventive concept, a cross section of an upper contact connected to an upper portion of a lower contact may have an area larger than a cross section of the lower contact connected to a source/drain region, and a concave portion may be formed between the lower contact and the upper contact. Thus, the alignment and a connection process of contacts, metal lines and the like may be efficiently and accurately performed.

While example embodiments have been shown and described above, it will be apparent to those skilled in the art that modifications and variations could be made without departing from the scope of the present inventive concept as defined by the appended claims.

What is claimed is:
1. A semiconductor device comprising:
a substrate having a plurality of fins protruding therefrom;
an active region on the plurality of fins;
a contact including a conductive region having a concave portion defining an upper portion and a lower portion of the conductive region;
an interlayer insulating layer on the active region; and
a side insulating layer interposed between the interlayer insulating layer and the lower portion of the contact,
wherein an upper surface of the side insulating layer is disposed at a height equal to or below that of the concave portion of the contact.

2. The semiconductor device of claim 1, wherein a width of the upper portion of the contact increases away from the active region.

3. The semiconductor device of claim 1, wherein a surface of the lower portion of the contact is convex.

4. The semiconductor device of claim 3, wherein a maximum width of the lower portion of the contact is located closer to the concave portion than the active region.

5. The semiconductor device of claim 1, wherein a height of the lower portion of the contact is greater than a height of the upper portion of the contact.

6. The semiconductor device of claim 1, wherein the conductive region comprises a metal layer and further comprising a metal silicide layer and a barrier metal layer on the metal layer.

7. The semiconductor device of claim 6, wherein a portion of the barrier metal layer contacts the interlayer insulating layer and a side surface of the upper portion of the contact.

8. The semiconductor device of claim 6, wherein a portion of the barrier metal layer and the side insulating layer are disposed between the interlayer insulating layer and the lower portion of the contact.

9. The semiconductor device of claim 1, wherein the interlayer insulating layer comprises silicon oxide and wherein the side insulating layer comprises silicon nitride.

10. The semiconductor device of claim 1, wherein the active region comprises spaced-apart first and second active regions on the plurality of fins and further comprising a gate structure extending transverse to the plurality of fins and disposed between the first and second active regions.

11. The semiconductor device of claim 10, wherein an upper surface of the gate structure is lower than at least a portion of the lower portion of the contact.

12. The semiconductor device of claim 1, wherein a bottom of the lower portion of the contact is grooved.

13. The semiconductor device of claim 1, wherein a bottom of the conductive region has at least three concave portions contacting an upper portion of the active region.

14. A semiconductor device comprising:
a plurality of fins protruding from a substrate;
an active region on the plurality of fins;
an interlayer insulating layer covering the active region;
a trench disposed in the interlayer insulating layer;
a contact disposed in the trench, connected to the active region and including a plurality of layers; and
a side insulating layer on an inner sidewall of the trench and including a material different from a material of the interlayer insulating layer, wherein at least one of the plurality of layers includes a lower region containing a first region having a width increased away from the active region and a second region disposed on the first region and having a width reduced away from the active region, and an upper region disposed on the lower region and having a width increased away from the active region, and wherein the side insulating layer is disposed only between the lower region limited by a concave portion of the contact and the interlayer insulating layer.

15. The semiconductor device of claim 14, wherein a bottom of the contact is grooved.

16. A semiconductor device comprising:
a plurality of fins protruding from a substrate;
an active region on the plurality of fins;
a contact on the active region and including a conductive region having a convex upper portion, a convex lower portion and a narrowed portion between the convex upper portion and the convex lower portion; and
an insulating layer conforming to a sidewall of the convex lower portion of the conductive region and terminating at the narrowed portion of the conductive region.

17. The semiconductor device of claim 16, further comprising a barrier layer between the insulating layer and the convex lower portion of the conductive region and extending on to a sidewall of the convex upper portion of the conductive region.

18. The semiconductor device of claim 16, wherein the active region comprises spaced-apart first and second active regions on the plurality of fins and further comprising a gate structure extending across the plurality of fins and disposed between the first and second active regions.

19. The semiconductor device of claim 16, wherein a bottom of the contact is grooved.

* * * * *